(12) United States Patent
Kim et al.

(10) Patent No.: US 11,672,157 B2
(45) Date of Patent: Jun. 6, 2023

(54) ELECTRONIC APPARATUS

(71) Applicant: Samsung Display Co., Ltd., Yongin-Si (KR)

(72) Inventors: Kwanghyeok Kim, Cheonan-si (KR); Yong-Hwan Park, Hwaseong-si (KR); Sanghyun Jun, Suwon-si (KR); Miyoung Kim, Hwaseong-si (KR); Soyeon Park, Yongin-si (KR); Sugwoo Jung, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/363,740

(22) Filed: Jun. 30, 2021

(65) Prior Publication Data

US 2022/0093693 A1    Mar. 24, 2022

(30) Foreign Application Priority Data

Sep. 24, 2020    (KR) .......................... 10-2020-0124173

(51) Int. Cl.
*H01L 27/32*    (2006.01)
*H01L 51/52*    (2006.01)
(Continued)

(52) U.S. Cl.
CPC .......... *H01L 27/323* (2013.01); *G06F 3/0412* (2013.01); *G06F 3/0445* (2019.05);
(Continued)

(58) Field of Classification Search
CPC ...... G06F 3/0445; G06F 3/0412; G06F 3/044; H01L 51/5253; H01L 27/323; H01L 27/3262; H01L 27/3276
See application file for complete search history.

(56) References Cited

U.S. PATENT DOCUMENTS 10,007,370 B2 *  6/2018  Park ...................... G06F 3/0412
10,606,397 B2 *  3/2020  Jun ....................... G06F 3/0446
(Continued)

FOREIGN PATENT DOCUMENTS

CN       113672113       11/2021
KR    10-2018-0078571     7/2018
(Continued)

*Primary Examiner* — Sardis F Azongha
(74) *Attorney, Agent, or Firm* — F. Chau & Associates, LLC

(57) ABSTRACT

An electronic device includes a display unit having a plurality of pixels. Each of the pixels includes a transistor and a light-emitting element. A plurality of signal lines is connected to the pixels. An encapsulation layer covers the pixels. The display unit includes a display region and a non-display region adjacent to the display region in a plan view. A sensing unit includes a plurality of sensing patterns overlapping the display region. A plurality of sensing pads overlaps the non-display region. A plurality of sensing lines electrically connects the sensing patterns and the sensing pads. A bridge line is connected to a first sensing line and a corresponding first sensing pad. The bridge line is bent to extend in a direction that is different from an extending direction of the first sensing line to connect the bridge line to the first sensing pad.

20 Claims, 14 Drawing Sheets

(51) Int. Cl.
*G06F 3/041* (2006.01)
*G06F 3/044* (2006.01)

(52) U.S. Cl.
CPC ...... *H01L 27/3262* (2013.01); *H01L 27/3276* (2013.01); *H01L 51/5253* (2013.01); *G06F 2203/04107* (2013.01); *G06F 2203/04111* (2013.01)

(56) References Cited

U.S. PATENT DOCUMENTS

| | | |
|---|---|---|
| 10,642,394 B2 | 5/2020 | Song et al. |
| 2020/0091252 A1 | 3/2020 | Bang et al. |
| 2021/0357057 A1 | 11/2021 | Kim et al. |

FOREIGN PATENT DOCUMENTS

| | | |
|---|---|---|
| KR | 10-2018-0124326 | 11/2018 |
| KR | 10-2020-0032291 | 3/2020 |
| KR | 10-2021-0142036 | 11/2021 |

\* cited by examiner

… (1) ELECTRONIC APPARATUS

CROSS-REFERENCE TO RELATED APPLICATIONS

This application claims priority under 35 U.S.C. § 119 to Korean Patent Application No. 10-2020-0124173, filed on Sep. 24, 2020 in the Korean Intellectual Property Office, the disclosure of which is incorporated by reference in its entirety herein.

1. TECHNICAL FIELD

The present inventive concepts relate to an electronic device capable of displaying an image and detecting an external input.

2. DISCUSSION OF RELATED ART

An electronic device is activated in response to an electric signal. The electronic device may include electronic components including various electronic elements such as a display unit for displaying an image and a sensing unit for detecting an external input. The electronic elements may be electrically connected to each other through variously arranged signal lines.

The electronic elements may be electrically connected to an external circuit through pads. As the integration density of the electronic elements and the number of signal lines increase, the area of a region for arranging signal lines may increase. Furthermore, an increased number of signal lines requires a fine patterning process for forming micro signal lines.

SUMMARY

The present inventive concepts provide an electronic device with a reduced bezel.

According to an embodiment of the present inventive concepts, an electronic device includes a display unit comprising a plurality of pixels. Each of the plurality of pixels includes a transistor and a light-emitting element. A plurality of signal lines is connected to the plurality of pixels. An encapsulation layer covers the plurality of pixels. The display unit includes a display region and a non-display region adjacent to the display region in a plan view. A sensing unit comprises a plurality of sensing patterns overlapping the display region. A plurality of sensing pads overlaps the non-display region. A plurality of sensing lines is electrically connected to the plurality of sensing patterns and the plurality of sensing pads. A bridge line is connected to a first sensing line of the plurality of sensing lines and a corresponding first sensing pad of the plurality of sensing pads. The bridge line is bent to extend in a direction that is different from an extending direction of the first sensing line to connect the bridge line to the first sensing pad.

In an embodiment, the bridge line may overlap, in a plan view, at least a portion of non-connected other sensing lines among the sensing lines.

In an embodiment, the electronic device may further include a shielding electrode arranged in a layer between the bridge line and the other sensing lines.

In an embodiment, the bridge line may be arranged under the encapsulation layer in a cross-sectional view.

In an embodiment, the bridge line may be arranged on the same layer as at least one of components of the transistor or components of the light-emitting element.

In an embodiment, the bridge line may be arranged on the same layer as at least one of the signal lines.

In an embodiment, the bridge line and the sensing line may be electrically connected through a connection portion penetrating a predetermined insulating layer, and the connection portion may not overlap the encapsulation layer in a plan view.

In an embodiment, the encapsulation layer may include a first inorganic layer, a second inorganic layer arranged on the first inorganic layer, and an organic layer arranged between the first inorganic layer and the second inorganic layer, and the connection portion may not overlap the first inorganic layer and the second inorganic layer.

In an embodiment, the sensing unit may further include a sensing insulating layer arranged between the sensing lines and the encapsulation layer, and the connection portion may penetrate the sensing insulating layer.

In an embodiment, the bridge line may overlap at least a portion of the signal lines in a plan view.

In an embodiment, the electronic device may further include an additional bridge line arranged on a layer different from that of one of the signal lines and electrically connected thereto, and the additional bridge line may overlap, in a plan view, at least a portion of non-connected other signal lines among the signal lines.

In an embodiment, the bridge line may overlap the display region in a plan view.

In an embodiment, the display unit may include a first portion having a first width in a first direction and a second portion having a second width different from the first width in the first direction.

According to an embodiment of the present inventive concepts, an electronic device includes a display unit comprising a plurality of pixels. Each of the plurality of pixels includes a transistor and a light-emitting element. An encapsulation layer covers the plurality of pixels. The display unit includes a display region and a non-display region adjacent to the display region in a plan view. A sensing unit comprising a plurality of sensing patterns overlaps the display region. A plurality of sensing pads overlaps the non-display region. A plurality of sensing lines is electrically connected to the plurality of sensing patterns and the plurality of sensing pads. A bridge line is connected to a first sensing line of the plurality of sensing lines and a corresponding first sensing pad of the plurality of sensing pads. A connection portion connects the bridge line and the first sensing line. The bridge line is arranged on a layer different from a layer that the plurality of sensing lines is arranged on. The connection portion does not overlap the encapsulation layer in the plan view.

In an embodiment, the encapsulation layer may include a first inorganic layer, a second inorganic layer arranged on the first inorganic layer, and an organic layer arranged between the first inorganic layer and the second inorganic layer, and the connection portion may not overlap the first inorganic layer and the second inorganic layer.

In an embodiment, the sensing unit may further include a sensing insulating layer arranged between the sensing lines and the encapsulation layer, the bridge line may be arranged under the encapsulation layer in a plan view, and the connection portion may penetrate the sensing insulating layer to connect the bridge line and the sensing line.

In an embodiment, the bridge line may be arranged on the same layer as one of the signal lines arranged under the encapsulation layer and connected to the pixels.

In an embodiment, the bridge line may overlap, in a plan view, at least a portion of non-connected other sensing lines among the sensing lines.

In an embodiment, the bridge line may overlap the display region in a plan view.

In an embodiment, the electronic device may further include a shielding electrode arranged in a layer between the bridge line and the sensing lines.

BRIEF DESCRIPTION OF THE FIGURES

The accompanying drawings are included to provide a further understanding of the present inventive concepts, and are incorporated in and constitute a part of this specification. The drawings illustrate embodiments of the present inventive concepts and, together with the description, serve to explain principles of the present inventive concepts. In the drawings.

DETAILED DESCRIPTION OF EMBODIMENTS

Figure 1A:
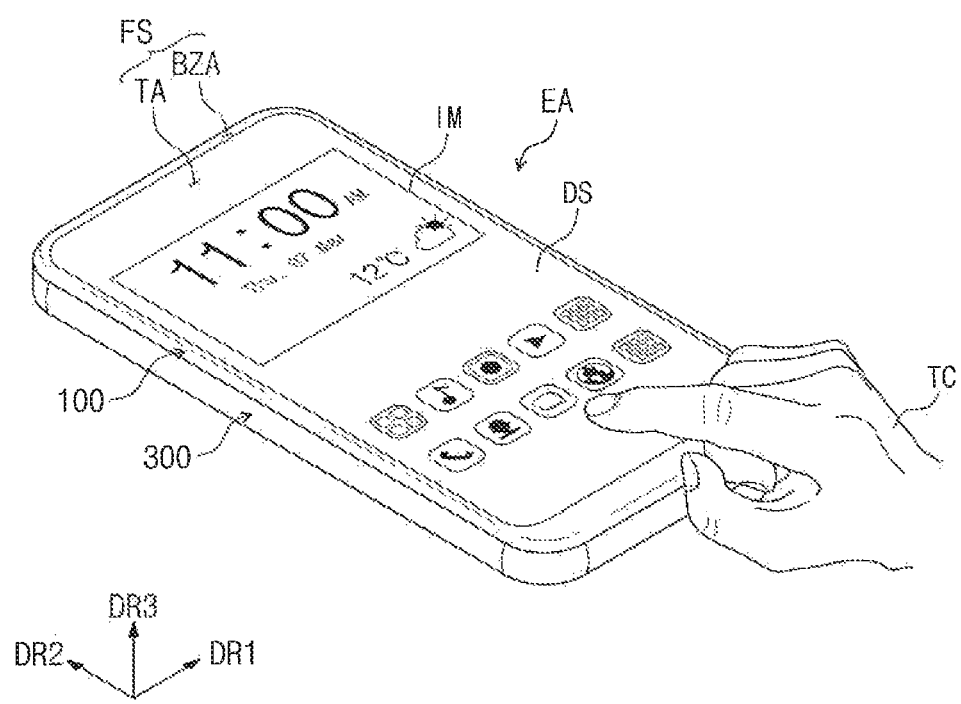
FIG. 1A is a perspective view of a combined electronic device according to an embodiment of the present inventive concepts.

It will be understood that when an element (or a region, layer, portion, or the like) is referred to as being "on", "connected to", or "coupled to" another element, it can be directly on or directly connected/coupled to the other element, or a third element may be present therebetween. When an element (or a region, layer, portion, or the like) is referred to as being "directly on", "directly connected to", or "directly coupled to" another element, no intervening elements may be present therebetween.

The same reference numerals refer to the same elements. In the drawings, the thicknesses, ratios, and dimensions of elements may be exaggerated for clarity of illustration.

As used herein, the term "and/or" includes any combinations that can be defined by associated elements.

The terms "first", "second" and the like may be used for describing various elements, but the elements should not be construed as being limited by the terms. Such terms may only used for distinguishing one element from other elements. For example, a first element could be termed a second element and vice versa without departing from the teachings of the present inventive concepts. The terms of a singular form may include plural forms unless otherwise specified.

Furthermore, the terms "under", "lower side", "on", "upper side", and the like are used to describe relationships among elements illustrated in the drawings. The terms, which are relative concepts, are used on the basis of directions illustrated in the drawings. However, embodiments of the present inventive concepts are not limited thereby.

All of the terms used herein (including technical and scientific terms) have the same meanings as understood by those skilled in the art, unless otherwise defined. Terms in common usage such as those defined in commonly used dictionaries may not be explicitly defined herein, should be interpreted to contextually match the meanings in the relevant art and should not be interpreted in an idealized or overly formal sense.

It will be further understood that the terms "include", "including", "has", "having", and the like, when used in this specification, specify the presence of stated features, numbers, steps, operations, elements, components, or combinations thereof, but do not preclude the presence or addition of one or more other features, numbers, steps, operations, elements, components, or combinations thereof.

Hereinafter, embodiments of the present inventive concepts will be described in detail with reference to the accompanying drawings.

Figure 1B:
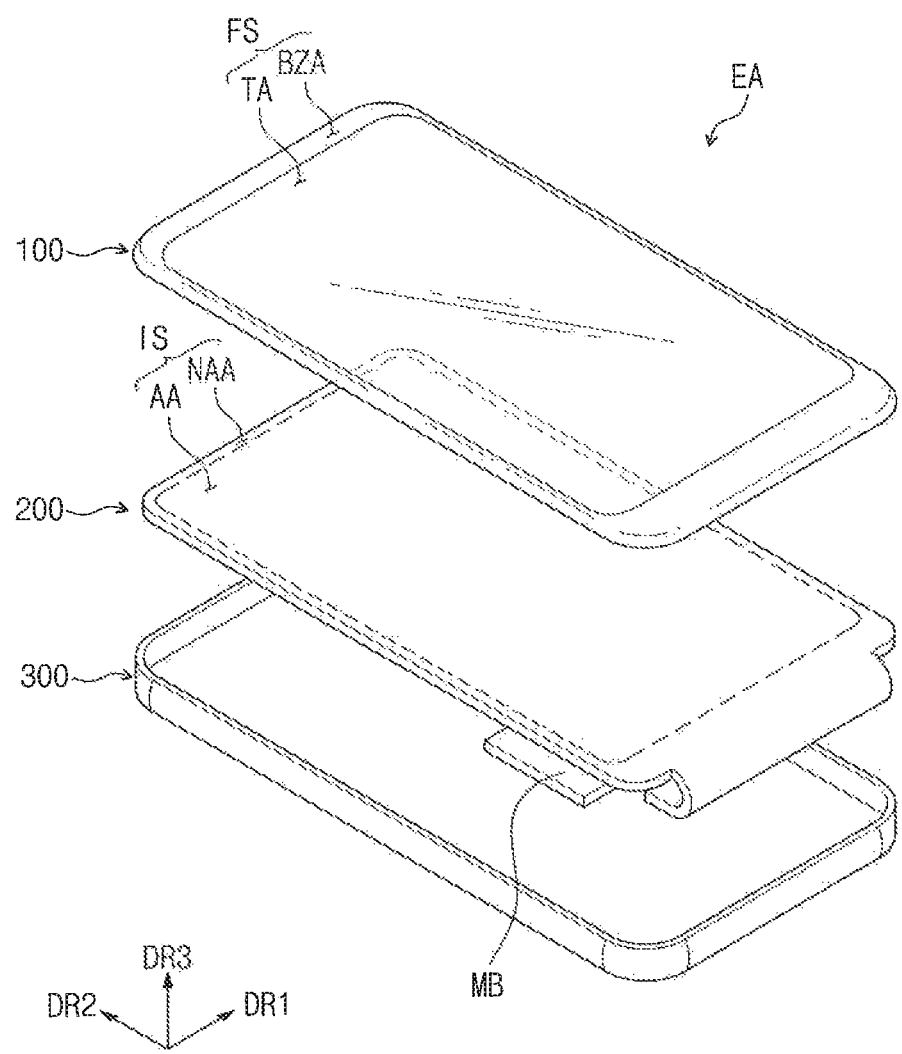
FIG. 1B is an exploded perspective view of an electronic device according to an embodiment of the present inventive concepts.

FIG. 1A is a combined perspective view of an electronic device according to an embodiment of the present inventive concepts. FIG. 1B is an exploded perspective view of an electronic device according to an embodiment of the present inventive concepts. An embodiment of the present inventive concepts will be described with reference to FIGS. 1A and 1B.

An electronic device EA may be a device which is activated in response to an electric signal. In an embodiment, the electronic device EA may display an image IM and detect an external input TC. The electronic device EA may include various embodiments. For example, the electronic device EA may include various small, medium and large devices, such as a tablet, a laptop computer, a computer, a smart television, etc. In the present embodiment, the electronic device EA is illustrated as a smart phone. However, embodiments of the present inventive concepts are not limited thereto.

The electronic device EA may display an image IM in a third direction DR3 (e.g., a thickness direction) on a display surface DS that is defined in a first direction DR1 and a second direction DR2. In an embodiment, a display surface DS on which the image IM is displayed, may correspond to a front surface of the electronic device EA and may correspond to a front surface FS of a window 100. Hereinafter, the display surface DS and front surface of the electronic device EA and the front surface FS of the window 100 may be referred to by the same reference sign. In an embodiment, the image IM may include at least one dynamic image and/or still image. A clock and a plurality of icons are illustrated as an example of the image IM in FIG. 1A. However, embodiments of the present inventive concepts are not limited thereto.

In the embodiment of FIG. 1A, front surfaces (e.g., a top surface) and rear surfaces (e.g., a bottom surface) of members are defined based on the direction in which the image IM is displayed. The front surfaces and the rear surfaces may oppose each other in the third direction DR3, and a normal direction of each of the front surfaces and the rear surfaces may be parallel with the third direction DR3. A distance between each of the front surfaces and each of the rear surfaces may correspond to a thickness of a display panel DP in the third direction DR3. The directions indicated by the first to third directions DR1 to DR3 are relative concepts and thus may be changed to other directions. Hereinafter, first to third directions which are indicated by the first to third directions DR1 to DR3 will be referred to by the same reference symbols.

In an embodiment, the electronic device EA may detect a user input TC applied externally. The user input TC includes various types of external inputs such as a part of a user's body, light, heat, or pressure. In the embodiment of FIG. 1A, the user input TC is illustrated as a user's hand applied to the front surface. However, embodiments of the present inventive concepts are not limited thereto, and the user input TC may be provided in various forms. Additionally, the electronic device EA may detect the user input TC applied to a side or rear surface of the electronic device EA in addition to or instead of the front surface, and is not limited to the embodiment shown in FIG. 1A.

As shown in the embodiment of FIG. 1B, the electronic device EA includes a window 100, an electronic panel 200, and an external case 300. In the present embodiment, the window 100 and the external case 300 are coupled to each other to form an exterior of the electronic device EA.

As illustrated in FIG. 1B, the electronic device EA may include the window 100, the electronic panel 200, and the external case 300. As shown in the embodiment of FIG. 1B, the external case 300, the electronic panel 200, and the window 100 may be sequentially stacked in the third direction DR3. However, embodiments of the present inventive concepts are not limited thereto.

In an embodiment, the window 100 may include an insulating panel. For example, the window 100 may include glass, plastic, or a combination thereof. However, embodiments of the present inventive concepts are not limited thereto.

The front surface FS of the window 100 defines the front surface of the electronic device EA, as described above. A transmissive region TA may be an optically clear region. For example, in an embodiment, the transmissive region TA may be a region having at least about 90% transmittance of visual light.

A bezel region BZA may have a relatively low light transmittance compared to the transmissive region TA. The bezel region BZA defines a shape of the transmissive region TA. As shown in the embodiment of FIG. 1B, the bezel region BZA may be adjacent to and surround the transmissive region TA. For example, the bezel region BZA may completely surround the transmissive region TA (e.g., in the first and second directions DR1, DR2). However, embodiments of the present inventive concepts are not limited thereto.

In an embodiment, the bezel region BZA may have a predetermined color. The bezel region BZA may cover a peripheral region NAA of the electronic panel 200 to prevent the peripheral region NAA from being externally viewed. However, embodiments of the present inventive concepts are not limited thereto. For example, in an embodiment, the window 100 may not include the bezel region BZA and may only include a transmissive region TA.

The electronic panel 200 may display the image IM and detect the external input TC. The image IM may be displayed on the front surface IS of the electronic panel 200. As shown in the embodiment of FIG. 1B, the front surface IS of the electronic panel 200 includes an active region AA and the peripheral region NAA. The active region AA may be a region which is activated in response to an electric signal.

In an embodiment, the active region AA may be a region in which the image IM is displayed and the external input TC is detected. The transmissive region TA overlaps (e.g., in the third direction DR3) at least the active region AA. For example, the transmissive region TA may overlap an entire surface of the active region AA or at least a partial portion thereof. Accordingly, a user may view the image IM or provide the external input TC through the transmissive region TA. However, embodiments of the present inventive concepts are not limited thereto and a region in which the image IM is displayed and a region in which the external input TC is detected may be separated from each other within the active region AA.

The peripheral region NAA may be a region covered with the bezel region BZA. For example, the bezel region BZA may overlap the peripheral region NAA in the third direction (DR3). The peripheral region NAA is adjacent to the active region AA. The peripheral region NAA may surround the active region AA. For example, as shown in the embodiment of FIG. 1B, the peripheral region NAA may completely surround the active region AA (e.g., in the first and second directions (DR1, DR2). However, embodiments of the present inventive concepts are not limited thereto. A driving circuit or driving wiring for driving the active region AA may be arranged in the peripheral region NAA.

The electronic panel 200 may include a display unit and a sensing unit. The image IM may be substantially displayed on the display unit, and the external input TC may be substantially detected by the sensing unit. Since the electronic panel 200 includes both the display unit and the sensing unit, the electronic panel 200 may display the image IM and also detect the external input TC. Relevant detailed descriptions will be provided later.

At least a partial portion of the electronic panel 200 may be bent. For example, as shown in the embodiment of FIG. 1B, a partial portion of the electronic panel 200, to which a circuit board MB is connected, may be bent towards a rear surface of the electronic panel 200 so that the circuit board MB may be assembled overlapping (e.g., in the third direction DR3) the rear surface of the electronic panel 200. According to an embodiment of the present inventive concepts, since a partial portion of the electronic panel 200 is bent, the area (e.g., in a plane defined in the first and second directions DR1, DR2) of the bezel region BZA can be relatively narrow.

Meanwhile, the electronic device EA may further include the circuit board MB connected to the electronic panel 200. The circuit board MB may be coupled to one side of the electronic panel 200 so as to be physically and electrically connected to the electronic panel 200. For example, as shown in the embodiment of FIG. 1B, the circuit board MB may be coupled to a lower portion of the electronic panel 200 (e.g., in the second direction DR2). However, embodiments of the present inventive concepts are not limited thereto. In an embodiment, the circuit board MB may generate an electric signal to be provided to the electronic panel 200, or may receive a signal generated by the electronic panel 200 to calculate a result value including information about a location in which the external input TC has been detected or a strength of the external input TC.

The external case 300 is coupled to the window 100 to define the exterior of the electronic device EA. The external case 300 provides a predetermined internal space. The electronic panel 200 may be accommodated in the internal space.

The external case 300 may include a material having a relatively high rigidity. For example, in an embodiment, the external case 300 may include at least one material selected from glass, plastic, and metal and may include a plurality of frames and/or plates. The external case 300 may stably protect components of the electronic device EA accommodated in the internal space from an external impact.

Figure 2:
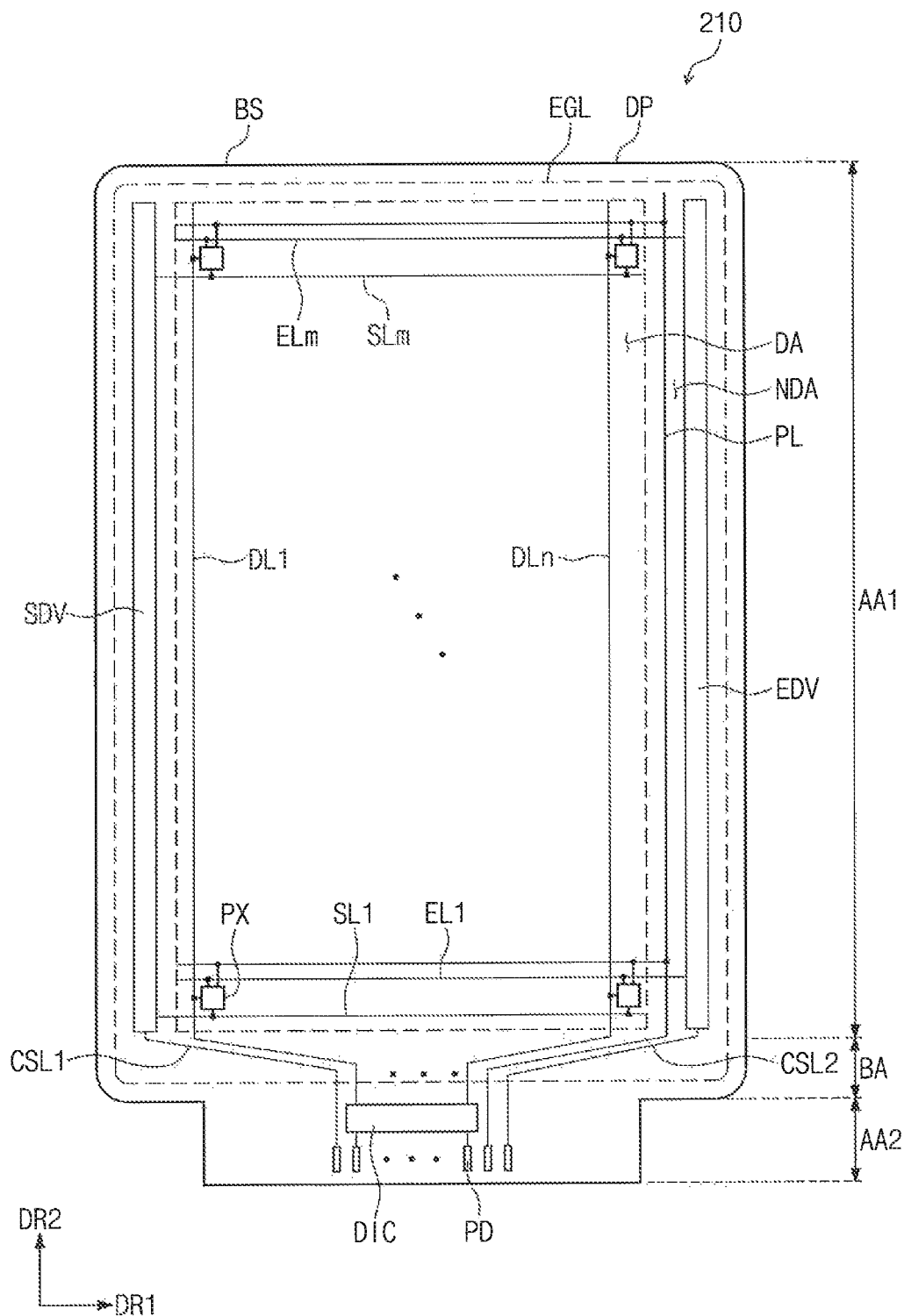
FIG. 2 is a plan view illustrating a display unit according to an embodiment of the present inventive concepts.
Figure 3:
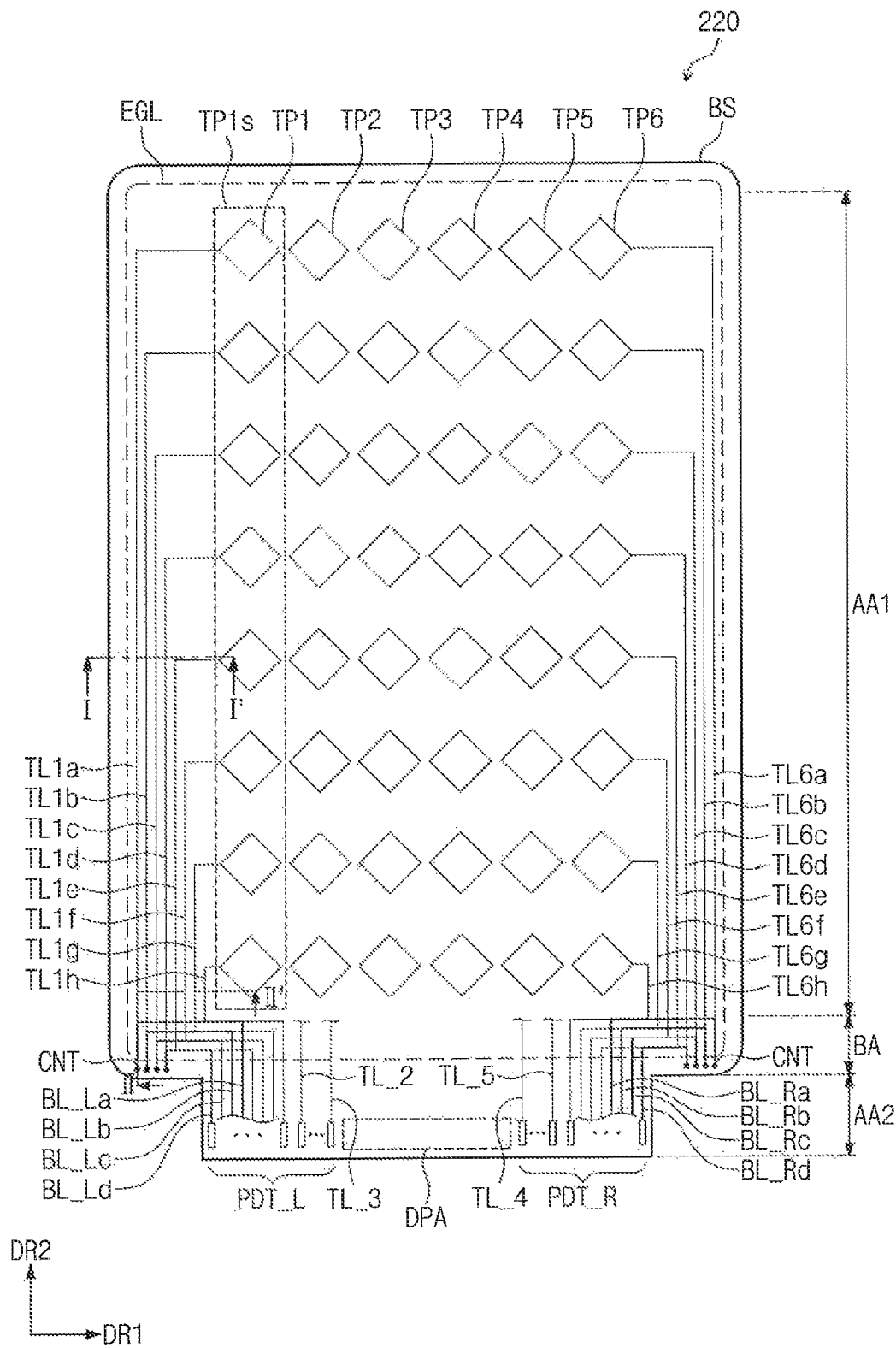
FIG. 3 is a plan view illustrating a sensing unit according to an embodiment of the present inventive concepts.

FIG. 2 is a plan view illustrating a display unit according to an embodiment of the present inventive concepts. FIG. 3 is a plan view illustrating a sensing unit according to an embodiment of the present inventive concepts. Hereinafter, the electronic panel 200 according to an embodiment of the present inventive concepts will be described with reference to FIGS. 2 and 3.

The electronic panel 200 may include a display unit 210 and a sensing unit 220 (FIG. 3). The display unit 210 generates the image IM. FIG. 2 illustrates some of components of the display unit 210 in a plan view.

For convenience of illustration, some of components of the display unit 210 are illustrated as blocks in FIG. 2. Referring to the embodiment of FIG. 2, the display unit 210 may include a base substrate BS, a scan driving circuit SDV, an emission driving circuit EDV, a driving chip DIC, a plurality of signal lines, such as a plurality of scan lines SL1 to SLm, a plurality of data lines DL1 to DLn, a plurality of emission lines EL1 to ELm, first and second control lines CSL1, CSL2, and a power line PL, a plurality of pixels PX, and a plurality of display pads PD.

The base substrate BS includes a first base region AA1, a second base region AA2, and a bending region BA, which are arranged in the second direction DR2. In an embodiment, the second base region AA2 and the bending region BA may be portions of a non-display region NDA. The bending region BA is arranged between the first base region AA1 and the second base region AA2 (e.g., in the second direction DR2).

The first base region AA1 may include a display surface DS illustrated in FIG. 1A. The second base region AA2 is spaced apart from the first base region AA1 with the bending region BA therebetween. As shown in the embodiment of FIGS. 2-3, the second base region AA2 and the bending region BA may have a relatively narrower width in the second direction DR2 as compared to the width of the first base region AA1 in the second direction DR2. For example, in the second direction DR2, the lengths of the bending region BA and the second base region AA2 may be less than a length of the first base region AA1. As shown in the embodiment of FIG. 2, the second base region AA2 may have a relatively narrower width in the first direction DR1 as compared to the first base region AA1 and the bending region BA. However, embodiments of the present inventive concepts are not limited thereto.

A region having a relatively short length in a bending axis direction may be more easily bent. However, embodiments of the present inventive concepts are not limited thereto. For example, the second base region AA2 and/or the bending region BA may have the same width as the first base region AA1 in the first direction DR1, and are not limited to a certain embodiment.

The bending region BA is bent with respect to a bending axis extending in the first direction DR1. The second base region AA2 may be oriented in the same direction as the first base region AA1 when the bending region BA is not bent, and may be oriented in an opposite direction to the first base region AA1 when the bending region BA is bent.

The above-mentioned circuit board MB (see FIG. 13) is physically connected to the second base region AA2. Since the bending region BA is bent, the circuit board MB is positioned on the rear surface of the electronic panel. Accordingly, the first base region AA1 defines the display surface DS, and the second base region AA2 and the bending region BA are not viewed through the display surface DS. Therefore, a bezel area of an electronic device may be reduced.

Each of the pixels PX includes a light-emitting element and a thin-film transistor connected to the light-emitting element. A shape of the display panel DP illustrated in the embodiment of FIG. 2 is substantially the same as a shape of the above-mentioned base substrate in a plan view. In an embodiment, a display region DA and a non-display region NDA may be divided according to the positioning of the light-emitting element.

The pixels PX are illustrated as being arranged in the display region DA in FIG. 2. The display region DA may be a region in which the image IM is displayed. However, embodiments of the present inventive concepts are not limited thereto and some of the pixels PX may include a thin-film transistor arranged in the non-display region NDA.

As shown in the embodiment of FIG. 2, the scan driving circuit SDV, the driving chip DIC, and the emission driving circuit EDV may be arranged in the non-display region NDA. The driving chip DIC may include a data driving circuit.

The signal lines may include a plurality of scan lines SL1 to SLm, a plurality of data lines DL1 to DLn, a plurality of emission lines EL1 to ELm, first and second control lines CSL1 and CSL2, and a power line PL. The plurality of display pads PD may be connected to the data lines DL1 to DLn, the first and second control lines CSL1 and CSL2, and the power line PL among the signal lines SL1 to SLm, DL1 to DLn, EL1 to ELm, CSL1, CSL2, and PL. Here, m and n are natural numbers. Each of the pixels PX may be connected to the scan lines SL1 to SLm, the data lines DL1 to DLn, and the emission lines EL1 to ELm.

As shown in the embodiment of FIG. 2, the scan lines SL1 to SLm may extend in the first direction DR1 and may be connected to the scan driving circuit SDV. The data lines DL1 to DLn may extend in the second direction DR2 and may be connected to the driving chip DIC via the bending region BA. The emission lines EL1 to ELm may extend in the first direction DR1 and may be connected to the emission driving circuit EDV.

In an embodiment, the power line PL may include a partial portion extending in the second direction DR2 and a partial portion extending in the first direction DR1. The partial portion extending in the first direction DR1 and the partial portion extending in the second direction DR2 may be arranged on different layers. The partial portion of the power line PL extending in the second direction DR2 may extend to the second base region AA2 via the bending region BA. The power line PL may provide a first voltage to the pixels PX.

The first control line CSL1 may be connected to the scan driving circuit SDV and may extend towards a lower end of the second base region AA2 via the bending region BA. The second control line CSL2 may be connected to the emission driving circuit EDV and may extend towards the lower end of the second base region AA2 via the bending region BA.

In a plan view, the display pads PD may be arranged adjacent to the lower end of the second base region AA2, such as the lower end of the second base region AA2 in the second direction DR2 when the display unit 210 is in an unbent state. The driving chip DIC, the power line PL, the first control line CSL1, and the second control line CSL2 may be connected to the display pads PD. In an embodiment, the circuit board MB may be electrically connected to the display pads PD through an anisotropic conductive adhesive layer.

An encapsulation layer edge EGL is indicated by a dash line in FIG. 2. The encapsulation layer edge EGL may be a line extending along an end of the encapsulation layer, such as an inorganic layer described below. The encapsulation layer edge EGL may be arranged in the non-display region NDA and may be defined outside the display region DA. Relevant detailed descriptions will be provided later.

For convenience of description, FIG. 3 illustrates the sensing unit 220 arranged on the base substrate BS. As illustrated in FIG. 3, the sensing unit 220 may include a plurality of sensing patterns, such as first to sixth sensing patterns TP1 to TP6, a plurality of sensing lines, such as first to sixth sensing lines TL1a to TL1h, TL2, TL3, TL4, TL5, and TL6a to TL6h, a plurality of bridge lines, such as first to fourth first and second bridge lines BL_La to BL_Ld and BL_Ra to BL_Rd, and a plurality of sensing pads, such as first and second sensing pads PDT_L and PDT_R.

As shown in the embodiment of FIG. 3, the sensing patterns are spaced apart from each other in the first direction DR1 and in the second direction DR2. In the present embodiment, the sensing patterns include a plurality of first to sixth sensing patterns TP1 to TP6 arranged in the first direction DR1. The first sensing patterns TP1 are spaced apart from the second to sixth sensing patterns TP2 to TP6 in the first direction DR1 and arranged in the second direction DR2. Likewise, the second to sixth sensing patterns TP2 to TP6 are spaced apart from each other in the first direction DR1 and arranged in the second direction DR2.

Each of the first to sixth sensing patterns TP1 to TP6 may form one column parallel with the second direction DR2. In FIG. 3, a first column TPIs formed by the first sensing patterns TP1 is indicated by a dash line.

Each of the first to sixth sensing patterns TP1 to TP6 may have conductivity. In an embodiment, each of the first to sixth sensing patterns TP1 to TP6 may include at least one material selected from a metal, transparent conductive oxide (TCO) and a conductive polymer material. In the embodiment of FIG. 3, each of the first to sixth sensing patterns TP1 to TP6 is illustrated in a rhombus shape. However, embodiments of the present inventive concepts are not limited thereto, and each of the first to sixth sensing patterns TP1 to TP6 may have various different shapes.

In an embodiment, the first to sixth sensing patterns TP1 to TP6 may be arranged overlapping the display region DA in which the image IM is displayed. Thus, each of the first to sixth sensing patterns TP1 to TP6 may be optically clear. However, embodiments of the present inventive concepts are not limited thereto. For example, in an embodiment, each of the first to sixth sensing patterns TP1 to TP6 may have a mesh shape. The first to sixth sensing patterns TP1 to TP6 may be provided in various manners without deteriorating visibility of the image IM, and are not limited to a certain embodiment.

In an embodiment, the sensing unit 220 may be operated in a self-capacitive manner. Thus, each of the first to sixth sensing patterns TP1 to TP6 receives independent detection signals and generates independent signals. The first to sixth sensing lines TL1a to TL1h, TL2, TL3, TL4, TL5, and TL6a to TL6h connect the sensing patterns TP1 to TP6 and corresponding first and second sensing pads PDT_L and PDT_R.

For convenience of description, FIG. 3 only illustrates a plurality of first sensing lines TL1a to TL1h connected to the first sensing patterns TP1 and a plurality of sixth sensing lines TL6a to TL6h among the first to sixth sensing lines TL1a to TL1h. TL2, TL3, TL4, TL5, and TL6a to TL6A. and only illustrates a partial portion of second to fifth sensing lines TL2, TL3, TL4, and TL5 connected to the 15 second to fifth sensing patterns TP2 to TP5. Further, embodiments of the present inventive concepts are not limited thereto and the numbers of the sensing patterns and sensing lines may vary.

The first sensing lines TL1a to TL1h are electrically connected to the first sensing patterns TP1 respectively. For example, the first sensing lines TL1a to TL1h transmit/receive electric signals to/from each of the first sensing patterns TP1, which form the first column TPIs.

Likewise, the second sensing lines TL2 are electrically connected to the second sensing patterns TP2 respectively, and the third sensing lines TL3 are electrically connected to the third sensing patterns TP3 respectively. The fourth sensing lines TL4 are electrically connected to the fourth sensing patterns TP4 respectively, and the fifth sensing lines TL5 are electrically connected to the fifth sensing patterns TP5 respectively. The sixth sensing lines TL6a to TL6h are electrically connected to the sixth sensing patterns TP6 respectively.

In the sensing unit 220 according to an embodiment of the present inventive concepts, at least a partial portion of the first to sixth sensing lines TL1a to TL1h, TL2, TL3, TL4, TL5, and TL6a to TL6h may be connected to the first and second sensing pads PDT_L and PDT_R through the first to fourth first and second bridge lines BL_La to BL_Ld and BL_Ra to BL_Rd. As shown in the embodiment of FIG. 3, four sensing lines TL1a to TL1d adjacent to a left side end of the base substrate BS in a plan view among the first sensing lines TL1a to TL1h are connected to first to fourth first bridge lines BL_La to BL_Ld, and four sensing lines TL6a to TL6d adjacent to a right side end of the base substrate BS in a plan view are connected to first to fourth second bridge lines BL_Ra to BL_Rd. However, embodiments of the present inventive concepts are not limited thereto.

The first to fourth first and second bridge lines BL_La to BL_Ld and BL_Ra to BL_Rd are respectively connected to corresponding first to sixth sensing lines TL1a to TL1h and TL6a to TL6h through a plurality of connection portions CNT. As shown in the embodiment of FIG. 3, the connection portions CNT may be arranged outside the encapsulation layer edge EGL. Therefore, electric connections between the first to fourth first and second bridge lines BL_La to BL_Ld and BL_Ra to BL_Rd and the first and sixth sensing lines TL1a to TL1h and TL6a to TL6h may be relatively easily established. Relevant detailed descriptions will be provided later.

In an embodiment, the first to fourth first and second bridge lines BL_La to BL_Ld and BL_Ra to BL_Rd have conductivity, and are arranged on a layer that is different from that of the first to sixth sensing lines TL1a to TL1h, TL2, TL3, TL4, TL5, and TL6a to TL6h. In an embodiment, the first to fourth first and second bridge lines BL_La to BL_Ld and BL_Ra to BL_Rd may be arranged on the same layer as at least one of the components of the display unit 210, such as at least one of the scan driving circuit SDV, the emission driving circuit EDV, the driving chip DIC, the scan lines SL1 to SLm, the data lines DL1 to DLn, the emission lines EL1 to ELm, and the pixels PX.

The first to fourth first and second bridge lines BL_La to BL_Ld and BL_Ra to BL_Rd may be bent from the first to sixth sensing lines TL1a to TL1h, TL2, TL3, TL4, TL5, and TL6a to TL6h and connected to the first and second sensing pads PDT_L and PDT_R. For example, the first to fourth first and second bridge lines BL_La to BL_Ld and BL_Ra to BL_Rd may extend to a path that is different from an extension path (e.g., an extending direction(s)) which the first to sixth sensing lines TL1a to TL1h, TL2, TL3, TL4, TL5, and TL6a to TL6h extend along, to be connected to the first and second sensing pads PDT_L and PDT_R.

The first to fourth first and second bridge lines BL_La to BL_Ld and BL_Ra to BL_Rd may overlap in a plan view at least a partial portion of non-connected sensing lines (e.g., sensing lines that the first to fourth first and second bridge lines BL_La to BL_Ld and BL_Ra to BL_Rd are not connected thereto) among the first to sixth sensing lines TL1a to TL1h, TL2, TL3, TL4, TL5, and TL6a to TL6h. For example, in a predetermined region, only four sensing lines TL1e to TL1h among the first sensing lines TL1a to TL1h may be disposed, and the other four sensing lines TL1a to TL1d may be arranged to overlap (e.g., in the third direction DR3) the four sensing lines TL1e to TL1h via the first to fourth first bridge lines BL_La to BL_Ld. Therefore, an area for arranging all of the first sensing lines TL1a to TL1h may be reduced, thus reducing an area of the non-display region NDA. Furthermore, since the number of sensing lines arranged on the same layer in a limited region is reduced, the difficulty of a manufacturing process may be reduced, thus increasing process reliability.

In an embodiment, the sensing pads may include first sensing pads PDT_L arranged on a left side and second sensing pads PDT_R arranged on a right side with respect to a display pad region DPA in which display pads PD are arranged. For convenience of illustration, FIG. 3 only illustrates some of the first and second sensing pads PDT_L and PDT_R.

In an embodiment, the first and second sensing pads PDT_L and PDT_R may be arranged on the same layer as the display pads PD. However, embodiments of the present inventive concepts are not limited thereto. For example, both the first and second sensing pads PDT_L and PDT_R may be arranged on one side with respect to the display pad region DPA, or the first and second sensing pads PDT_L and PDT_R may be arranged on a layer that is different from that of the display pads PD, and are not limited to a certain embodiment.

The first and second sensing pads PDT_L and PDT_R and the display pads PD are connected to the circuit board MB so as to transmit/receive electric signals. However, embodiments of the present inventive concepts are not limited thereto. For example, the first and second sensing pads PDT_L and PDT_R and the display pads PD may be respectively connected to differentiated circuit boards so as to be independently controlled, and are not limited to a certain embodiment.

Figure 4A:
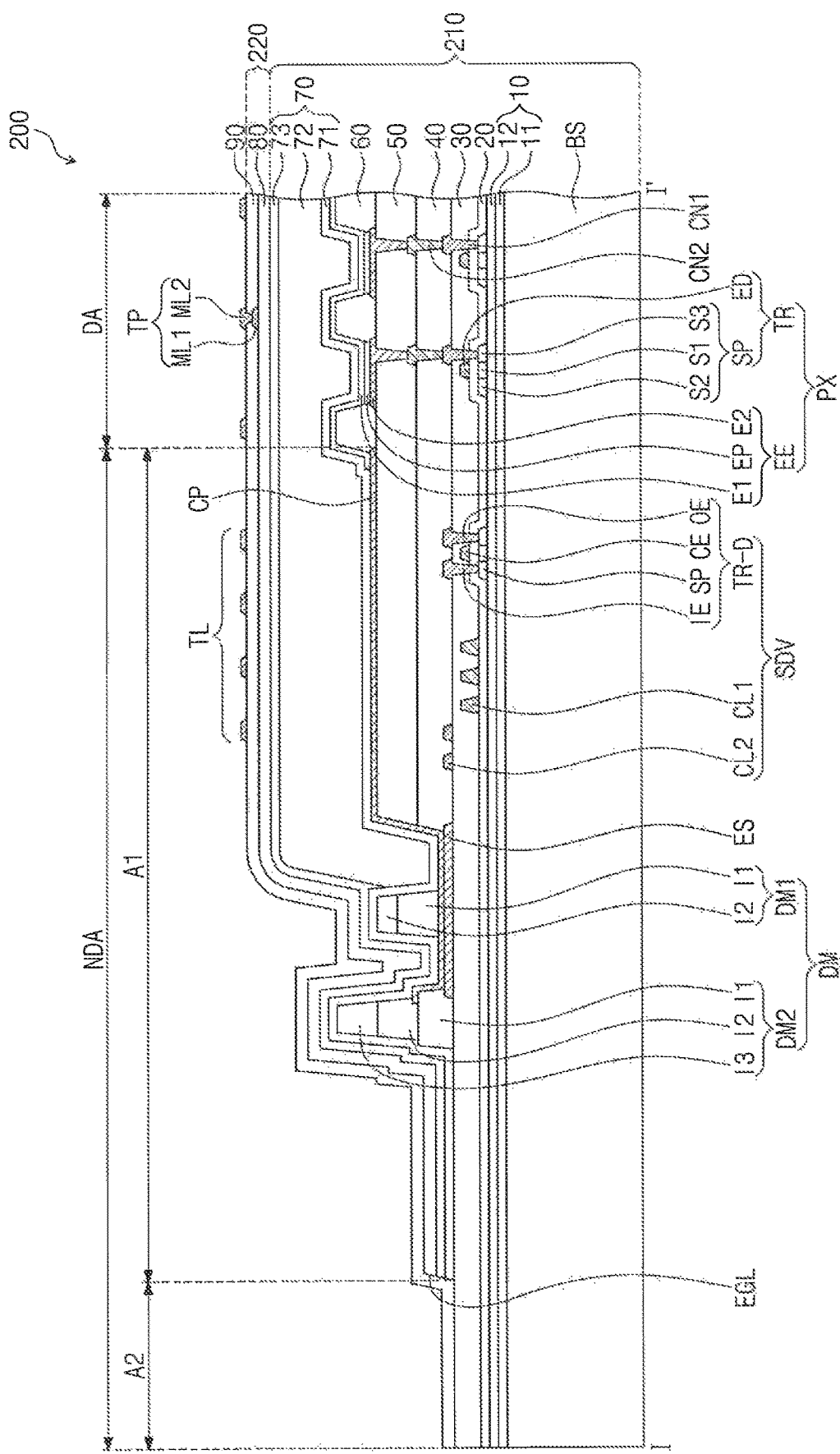
FIG. 4A is a cross-sectional view taken along line I-I' of FIG. 3 illustrating portions of an electronic device according to an embodiment of the present inventive concepts.
Figure 4B:
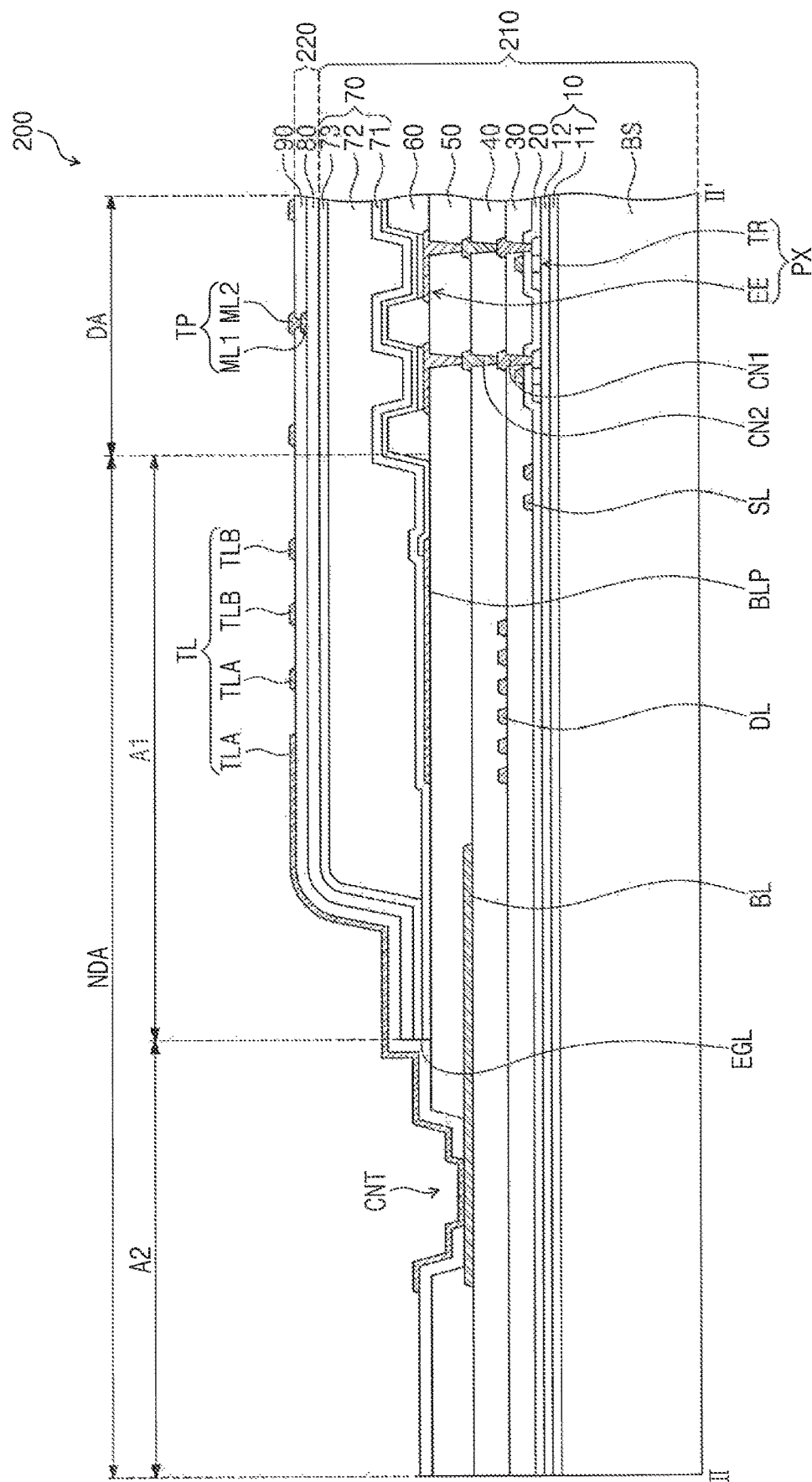
FIG. 4B is a cross-sectional view taken along line II-II' of FIG. 3 illustrating portions of an electronic device according to an embodiment of the present inventive concepts.

FIGS. 4A and 4B are cross-sectional views illustrating portions of an electronic device according to an embodiment of the present inventive concepts. FIG. 4A is a cross-sectional view of the electronic device taken along line I-I' of FIG. 3, and FIG. 4B is a cross-sectional view of the electronic device taken along line II-II' of FIG. 3. An embodiment of the present inventive concepts will be described with reference to FIGS. 4A and 4B.

As illustrated in the embodiments of FIGS. 2, 4A and 4B, the display unit 210 and the sensing unit 220 may be stacked in the electronic panel 200. The display unit 210 may include a plurality of insulating layers, such as first to seventh insulating layers 10, 20, 30, 40, 50, 60, and 70 arranged on the base substrate BS. The above-mentioned pixels PX, signal lines, such as the plurality of scan lines SL1 to SLm, the plurality of data lines DL1 to DLn, the plurality of emission lines EL1 to ELm, first and second control lines CSL1, CSL2, and power line PL, and components included in the scan driving circuit SDV may be arranged between the base substrate BS and the first to seventh insulating layers 10, 20, 30, 40, 50, 60, and 70.

In an embodiment, the base substrate BS has insulating properties. The base substrate BS may have flexibility so as to be bendable. For example, in an embodiment, the base substrate BS may be an insulative polymer film.

A first insulating layer 10 may be arranged on the base substrate BS. The first insulating layer 10 may include a barrier layer 11 and a buffer layer 12. The barrier layer 11 prevents foreign matter from being introduced from the outside. In an embodiment, the barrier layer 11 may include at least one of a silicon oxide layer or a silicon nitride layer. Each of the silicon oxide layer and the silicon nitride layer may be provided in plurality, and silicon oxide layers and silicon nitride layers may be stacked alternately. However, embodiments of the present inventive concepts are not limited thereto.

The buffer layer 12 may be arranged on the barrier layer 11. The buffer layer 12 increases a bond strength between the base substrate BS and a semiconductor pattern and/or a conductive pattern. In an embodiment, the buffer layer 12 may include at least one of a silicon oxide layer or a silicon nitride layer. The silicon oxide layers and the silicon nitride layers may be stacked alternately.

The pixels PX are arranged on the first insulating layer 10. FIGS. 4A and 4B illustrate some of the components of one pixel PX. The pixel PX may include a transistor TR and a light-emitting element EE.

The transistor TR may include a semiconductor pattern SP and a gate ED. The semiconductor pattern SP may be arranged on the first insulating layer 10. The semiconductor pattern SP may include a channel S1, a source S2, and a drain S3. In an embodiment, the semiconductor pattern SP may include a silicon semiconductor such as a single-crystal silicon semiconductor, a polysilicon semiconductor, or an amorphous silicon semiconductor. However, embodiments of the present inventive concepts are not limited thereto. For example, the semiconductor pattern SP may include an oxide semiconductor or may be formed of various other materials having semiconductor properties.

The semiconductor pattern SP has different electric properties according to whether the semiconductor pattern SP is doped. The semiconductor pattern SP may include a doped region and a non-doped region. In an embodiment, the doped region may be doped with an N-type dopant or P-type dopant. A P-type transistor includes a doped region doped with a P-type dopant. The doped region has higher conductivity than that of the non-doped region, and substantially serves as an electrode or a signal line. The non-doped region substantially corresponds to a channel (or active) of a transistor. For example, a partial portion of the semiconductor pattern SP may be the channel S1 of the transistor TR, another partial portion may be the source S2 or drain S3 of the transistor TR, and another partial portion may be a connection signal line (or connection electrode).

The second insulating layer 20 is arranged on the first insulating layer 10 to cover the semiconductor pattern SP. The second insulating layer 20 may be arranged between the gate ED and the semiconductor pattern SP of the transistor TR (e.g., in the third direction DR3). The second insulating layer 20 may be an inorganic layer and/or organic layer, and may have a single-layer or multi-layer structure. In an embodiment, the second insulating layer 20 may include at least one compound selected from aluminum oxide, titanium oxide, silicon oxide, silicon oxynitride, zirconium oxide, and hafnium oxide. For example, in an embodiment, the second insulating layer 20 may be a single layer of a silicon oxide layer. The inorganic layer described below may include at least one of the above-mentioned materials.

The gate ED may be arranged on the second insulating layer 20. In an embodiment, the gate ED may be a portion of a metal pattern. The gate ED may overlap the channel S1 in a plan view. The gate ED may function as a mask during a process of doping the semiconductor pattern SP.

A third insulating layer 30 may be arranged on the second insulating layer 20 and may cover the gate ED. In an embodiment, the third insulating layer 30 may be an inorganic layer and may have a single-layer or multi-layer structure. For example, in an embodiment, the third insulating layer 30 may be a single layer of a silicon oxide layer.

However, embodiments of the present inventive concepts are not limited thereto, and the source S2 and the drain S3 may be electrodes formed independent of the semiconductor pattern SP in the transistor TR. The source S2 and the drain S3 may be in direct contact with the semiconductor pattern SP or may pass through an insulating layer so as to be connected to the semiconductor pattern SP. Furthermore, the gate ED may be arranged under the semiconductor pattern SP. However, the transistor TR according to an embodiment of the present inventive concepts may be formed as various structures, and is not limited to a certain embodiment.

A fourth insulating layer 40 may be arranged on the third insulating layer 30. The fourth insulating layer 40 may be an organic layer and may have a single-layer or multi-layer structure. For example, in an embodiment, the fourth insulating layer 40 may be a single layer of a polyimide-based resin layer. However, embodiments of the present inventive concepts are not limited thereto, and the fourth insulating layer 40 may also include at least one compound selected from acrylic resin, methacrylic resin, polyisoprene, vinyl-based resin, epoxy-based resin, urethane-based resin, cellulosic resin, siloxane resin, polyamide-based resin, and perylene-based resin. The organic layer described below may include at least one of the above-mentioned materials.

A first connection electrode CN1 may be arranged on the third insulating layer 30, and a second connection electrode CN2 may be arranged on the fourth insulating layer 40. The first connection electrode CN1 may penetrate the second insulating layer 20 and the third insulating layer 30 so as to be electrically connected to the semiconductor pattern SP. The second connection electrode CN2 may penetrate the fourth insulating layer 40 so as to be electrically connected to the first connection electrode CN1.

However, embodiments of the present inventive concepts are not limited thereto. For example, at least one of the first connection electrode CN1 or the second connection electrode CN2 may not be provided. In an embodiment, an additional connection electrode that connects the light-emitting element EE and the transistor TR may be further arranged. According to the number of insulating layers arranged between the light-emitting element EE and the transistor TR, a method of electrically connecting the light-emitting element EE and the transistor TR may be variously changed, and is not limited to a certain embodiment.

A fifth insulating layer 50 may be arranged on the fourth insulating layer 40 and may cover the second connection electrode CN2. In an embodiment, the fifth insulating layer 50 may be an organic layer or inorganic layer and may have a single-layer or multi-layer structure.

The light-emitting element EE may be arranged on the fifth insulating layer 50. The light-emitting element EE may include a first electrode E1, an emission layer EP, and a second electrode E2. The first electrode E1 may be electrically connected to the transistor TR via the first connection electrode CN1 and the second connection electrode CN2.

A sixth insulating layer 60 is arranged on the fifth insulating layer 50 and exposes at least a partial portion of the first electrode E1 In an embodiment, the sixth insulating layer 60 may be a pixel defining film. For example, as shown in the embodiment of FIG. 4A, the sixth insulating layer 60 may be disposed on lateral edges of the first electrode E1 and may expose a central portion of the first electrode E1. The sixth insulating layer 60 (hereinafter referred to as a pixel defining film) may be an inorganic layer, an organic layer, or a combination thereof, and may have a single-layer or multi-layer structure.

The emission layer EP may be arranged on the first electrode E1. The emission layer EP may provide light of a predetermined color. In the embodiment of FIG. 4A, the emission layer EP is illustrated as a patterned single layer. However, embodiments of the present inventive concepts are not limited thereto. For example, the emission layer EP may have a multi-layer structure. Furthermore, the emission layer EP may also extend towards an upper surface of the pixel defining film 60 and may be commonly provided to a plurality of pixels.

The second electrode E2 may be arranged on the emission layer EP. In an embodiment, an electron control layer (e.g., an electron control region) may be arranged between the second electrode E2 and the emission layer EP, and a hole control layer (e.g., a hole control region) may be arranged between the first electrode E1 and the emission layer EP.

A seventh insulating layer 70 is arranged on the pixel defining film 60 and covers the light-emitting element EE. In an embodiment, the seventh insulating layer 70 may be an encapsulation layer. The seventh insulating layer 70 (hereinafter referred to as an encapsulation layer) may include a first inorganic layer 71, an organic layer 72, and a second inorganic layer 73. However, embodiments of the present inventive concepts are not limited thereto and the numbers of the organic layers and second inorganic layers included in the encapsulation layer may vary.

The first inorganic layer 71 may be arranged on the second electrode E2. The organic layer 72 may be arranged on the first inorganic layer 71. The second inorganic layer 73 may be arranged on the organic layer 72 and may cover the organic layer 72. In an embodiment, the first inorganic layer 71 and the second inorganic layer 73 may include a silicon nitride layer, a silicon oxynitride layer, a silicon oxide layer, a titanium oxide layer, or an aluminum oxide layer. However, embodiments of the present inventive concepts are not limited thereto. The organic layer 72 may include an acrylic organic layer. However, embodiments of the present inventive concepts are not limited thereto. The first inorganic layer 71 and the second inorganic layer 73 may protect the light-emitting element EE from moisture/oxygen or foreign matter.

The scan driving circuit SDV may include a driving transistor TR-D, a plurality of first signal lines CL1, and a plurality of second signal lines CL2. The driving transistor TR-D is arranged on the first insulating layer 10. The driving transistor TR-D may include the semiconductor pattern SP, a gate CE, a source IE, and a drain OE. Each of the gate CE, the source IE, and the drain OE may be formed as an electrode independent of the semiconductor pattern SP. The source IE and the drain OE are arranged on the third insulating layer 30 and penetrate the second insulating layer 20 and the third insulating layer 30 so as to be connected to the semiconductor pattern SP.

However, embodiments of the present inventive concepts are not limited thereto. For example, the driving transistor TR-D may be formed as the same structure as the transistor TR of the pixel PX. In this embodiment, since the driving transistor TR-D may be formed through the same process as the transistor TR of the pixel PX, a manufacturing process may be simplified and a process cost may be reduced.

As shown in the embodiment of FIG. 4A, the first signal lines CL1 and the second signal lines CL2 are arranged on different layers. For example, the first signal lines CL1 may be arranged on the same layer as the gate CE, and the second signal lines CL2 may be arranged on the same layer as the source IE or the drain OE. The first signal lines CL1 and the second signal lines CL2 electrically connect the driving transistor TR-D and other components of the scan driving circuit SDV. However, embodiments of the present inventive concepts are not limited thereto. For example, in an embodiment, either of the first signal lines CL1 or the second signal lines CL2 may not be provided or may be variously arranged.

A power supply pattern ES is arranged in the non-display region NDA. The power supply pattern ES is electrically connected to the second electrode E2. The power supply pattern ES provides a power supply voltage to the second electrode E2.

Furthermore, as shown in the embodiment of FIG. 4A, the electronic panel 200 may include a conductive pattern CP. The conductive pattern CP may be provided with the same voltage as the power supply pattern ES. The conductive pattern CP may be arranged between sensing lines TL and the scan driving circuit SDV and may overlap each of the sensing lines TL and the scan driving circuit SDV in a plan view. The conductive pattern CP may serve as a shielding electrode. For example, the conductive pattern CP prevents generation of a parasitic capacitance between the sensing lines TL and the scan driving circuit SDV. Therefore, noise may be reduced, which may be generated since a signal that is transferred to the sensing lines TL is changed by the scan driving circuit SDV.

As shown in the embodiment of FIG. 4A, dam portions may include a first dam portion DM1 and a second dam portion DM2. The first and second dam portions DM1 and DM2 are sequentially arranged in a direction away from the display region DA.

The first and second dam portions DM1 and DM2 prevent overflow of the organic layer 72. In an embodiment, each of the first and second dam portions DM1 and DM2 may include two layers 11 and 12 or three layers 11, 12, and 13. For example, as shown in the embodiment of FIG. 4A, the first dam portion DM1 may include two layers 11 and 12 and the second dam portion DM2 may include three layers 11, 12, and 13. However, embodiments of the present inventive concepts are not limited thereto. For example, each of the first and second dam portions DM1 and DM2 may have various structures, and is not limited to a certain embodiment.

As shown in the embodiment of FIG. 4A, the non-display region NDA may be divided into a first region A1 and a second region A2 with respect to the edge EGL of the encapsulation layer 70. The first region A1 may be a region in which the encapsulation layer 70 is disposed therein, and the second region A2 may be a region in which the encapsulation layer 70 is not disposed therein. The edge EGL of the encapsulation layer 70 may be defined by ends of the first inorganic layer 71 and the second inorganic layer 73, and may be formed in a shape surrounding the display region DA. The edge EGL of the encapsulation layer 70 may be defined outside of the first and second dam portions DM1 and DM2.

The sensing unit 220 may be arranged on the display unit 210. The sensing unit 220 may include a first conductive layer ML1, a second conductive layer ML2, a first sensing insulating layer 80, and a second sensing insulating layer 90. The first conductive layer ML1 may be arranged on the first sensing insulating layer 80. The second conductive layer ML2 is arranged on a layer different from the first conductive layer ML. For example, the second conductive layer ML2 may be arranged on the second sensing insulating layer 90. The second sensing insulating layer 90 is arranged on the first sensing insulating layer 80 to cover the first conductive layer ML1.

At least one of the first conductive layer ML1 or the second conductive layer ML2 forms a sensing pattern TP. In the embodiment of FIG. 4A, the sensing pattern TP may have a mesh shape, and may include the first conductive layer ML1 and the second conductive layer ML2 connected to the first conductive layer ML1. However, embodiments of the present inventive concepts are not limited thereto. For example, the sensing pattern TP may be a portion of either the first conductive layer ML1 or the second conductive layer ML2. In an embodiment, the sensing pattern TP may be a single-shape pattern overlapping a plurality of light-emitting elements EE. Furthermore, the first conductive layer ML1 or the second conductive layer ML2 may include a transparent conductive oxide or opaque metal. However, embodiments of the present inventive concepts are not limited thereto.

A portion of the second conductive layer ML2 may form the sensing lines TL. For example, in the embodiment of FIG. 4A, the sensing lines TL are illustrated as being arranged on the second sensing insulating layer 90. However, embodiments of the present inventive concepts are not limited thereto. For example, the sensing lines TL may be a portion of the first conductive layer ML1, and are not limited to a certain embodiment.

As shown in the embodiment of FIG. 4A, the first sensing insulating layer 80 may be extended along the edge EGL of the encapsulation layer. However, embodiments of the present inventive concepts are not limited thereto. For example, the first sensing insulating layer 80 may extend to an outer side of the edge EGL of the encapsulation layer so as to be arranged in the second region A2, and is not limited to a certain embodiment.

As illustrated in the embodiment of FIG. 4B, a portion of the sensing lines TL may be electrically connected to a bridge line BL. For convenience of illustration, among the sensing lines TL, two of first lines TLA connected to the bridge line BL and two of second lines TLB directly connected to the First and second sensing pads PDT_L and PDT_R (see FIG. 3) without being connected to the bridge line BL are exemplarily illustrated in FIG. 4B.

Each of the first lines TLA is connected to a corresponding bridge line BL. The bridge line BL may be arranged between the fourth insulating layer 40 and the fifth insulating layer 50. For example, as shown in the embodiment of FIG. 4B, a lower surface of the bridge line BL may directly contact an upper surface of the fourth insulating layer 40 and the fifth insulating layer 50 may cover an upper surface and lateral side surfaces of the bridge line BL. The connection portion CNT is arranged in the second region A2 and penetrates the fifth insulating layer 50 and a second sensing insulating layer 90 so as to connect one first line TLA and the bridge line BL corresponding thereto.

As shown in the embodiment of FIG. 4B, the bridge line BL is formed on a layer under the encapsulation layer 70 (e.g., below the encapsulation layer 70 in the third direction DR3). The bridge line BL may be arranged on the same layer as any one of components of the display unit 210. For example, the bridge line BL may be arranged on the same layer as the plurality of data lines DL1 to DLm (see FIG. 2) or the plurality of gate lines GL1 to GLn (see FIG. 2). In an embodiment, the bridge line BL may be arranged on the same layer as the gate ED, the first connection electrode CN1, or the second connection electrode CN2. Therefore, the bridge line BL may be arranged without electric interference in a location in which the bridge line BL overlaps the sensing lines TL in a plan view. For example, as shown in the embodiment of FIG. 4B, the bridge line BL is arranged on the same layer as the second connection electrode CN2. However, embodiments of the present inventive concepts are not limited thereto.

Since the connection portion CNT is arranged in the second region A2 in which the pixel defining film 60 and the encapsulation layer 70 is not disposed, the bridge line BL and the sensing line TLA may be electrically connected without requiring a process of forming a contact hole in the encapsulation layer 70 or the pixel defining film 60. Therefore, a manufacturing process may be simplified and a process cost may be reduced.

Figure 5:
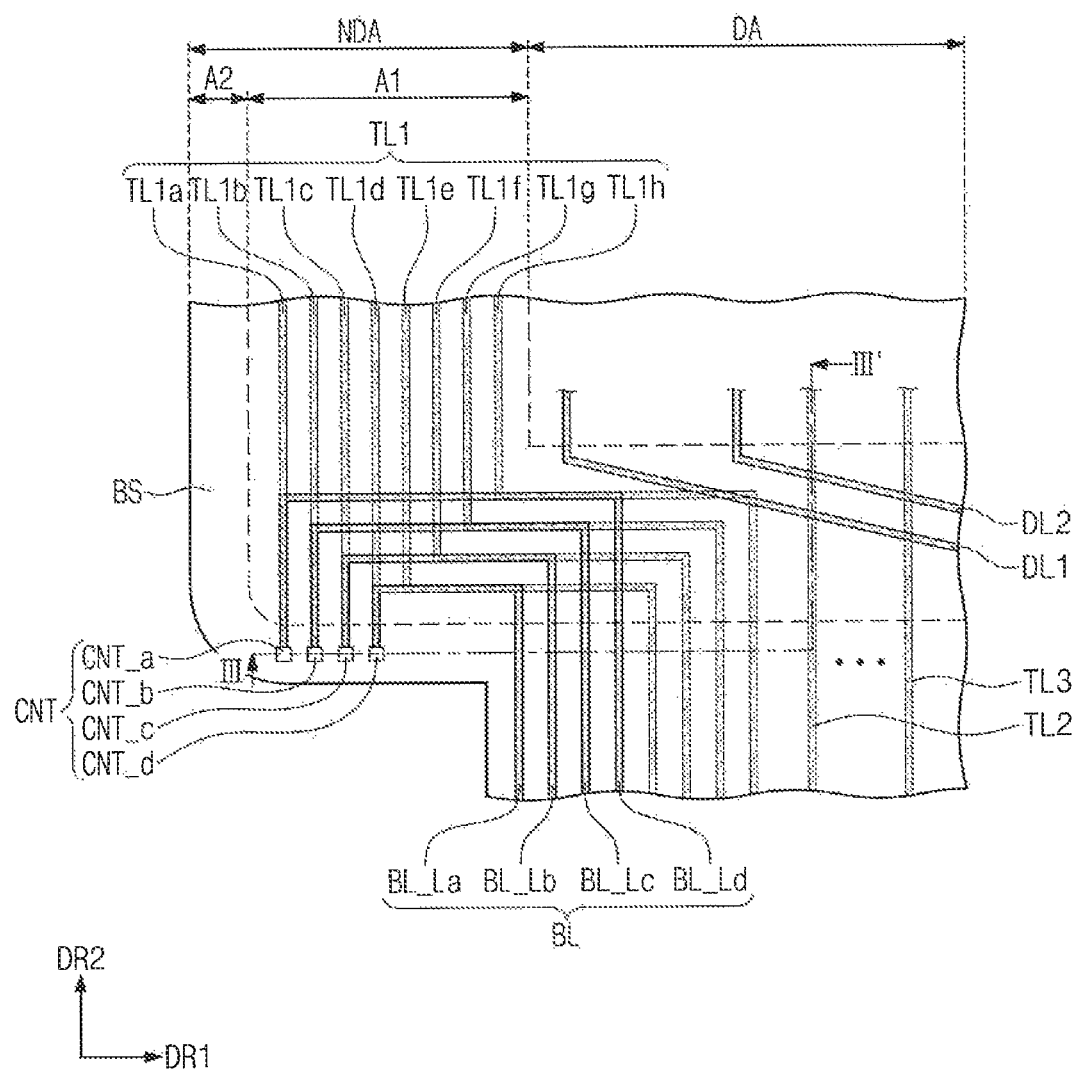
FIG. 5 is a plan view illustrating a portion of an electronic device according to an embodiment of the present inventive concepts.
Figure 6A:
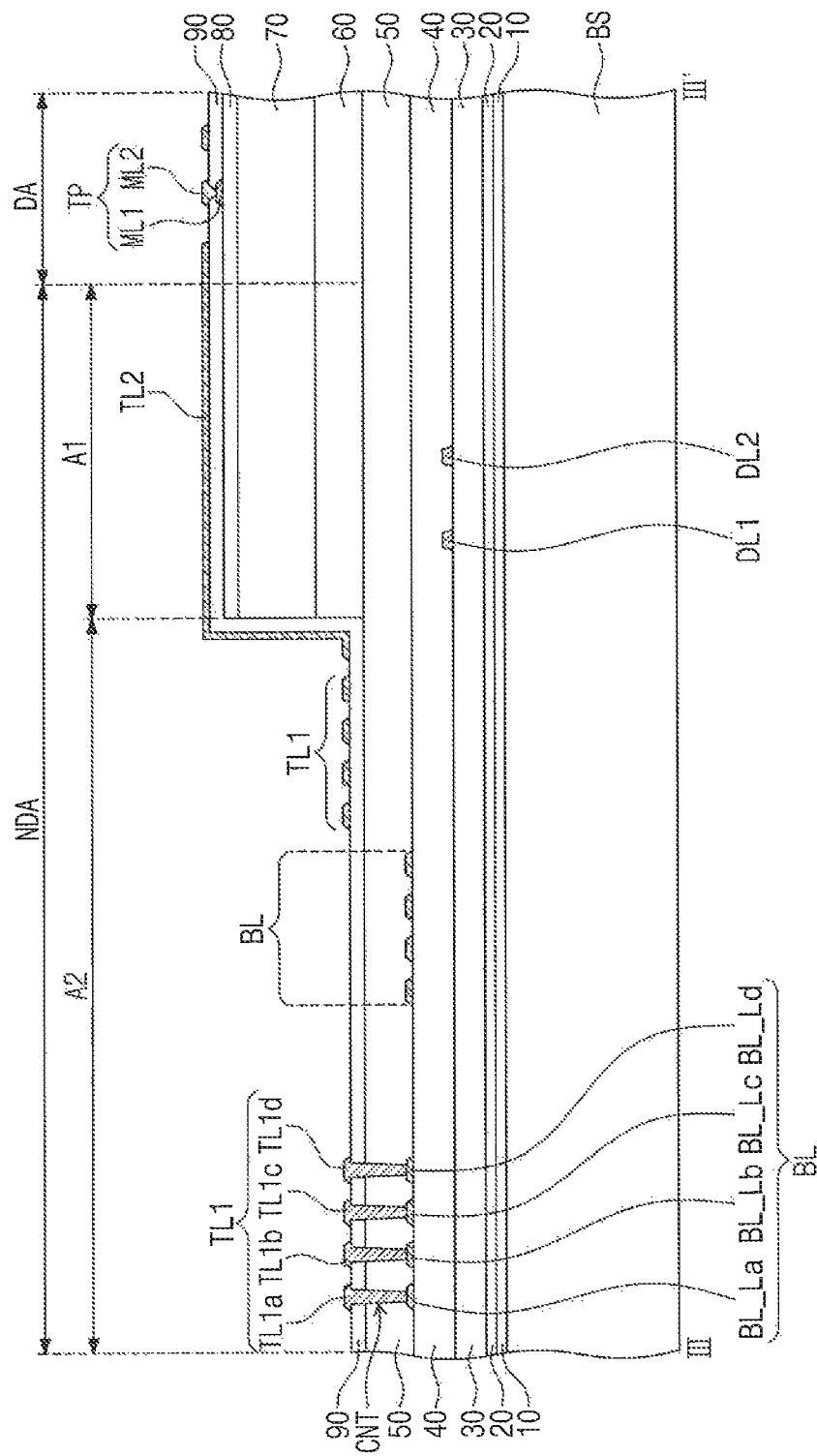
FIGS. 6A to 6C are cross-sectional views taken along line III-III' of FIG. 5 illustrating portions of an electronic device according to embodiments of the present inventive concepts.
Figure 6B:
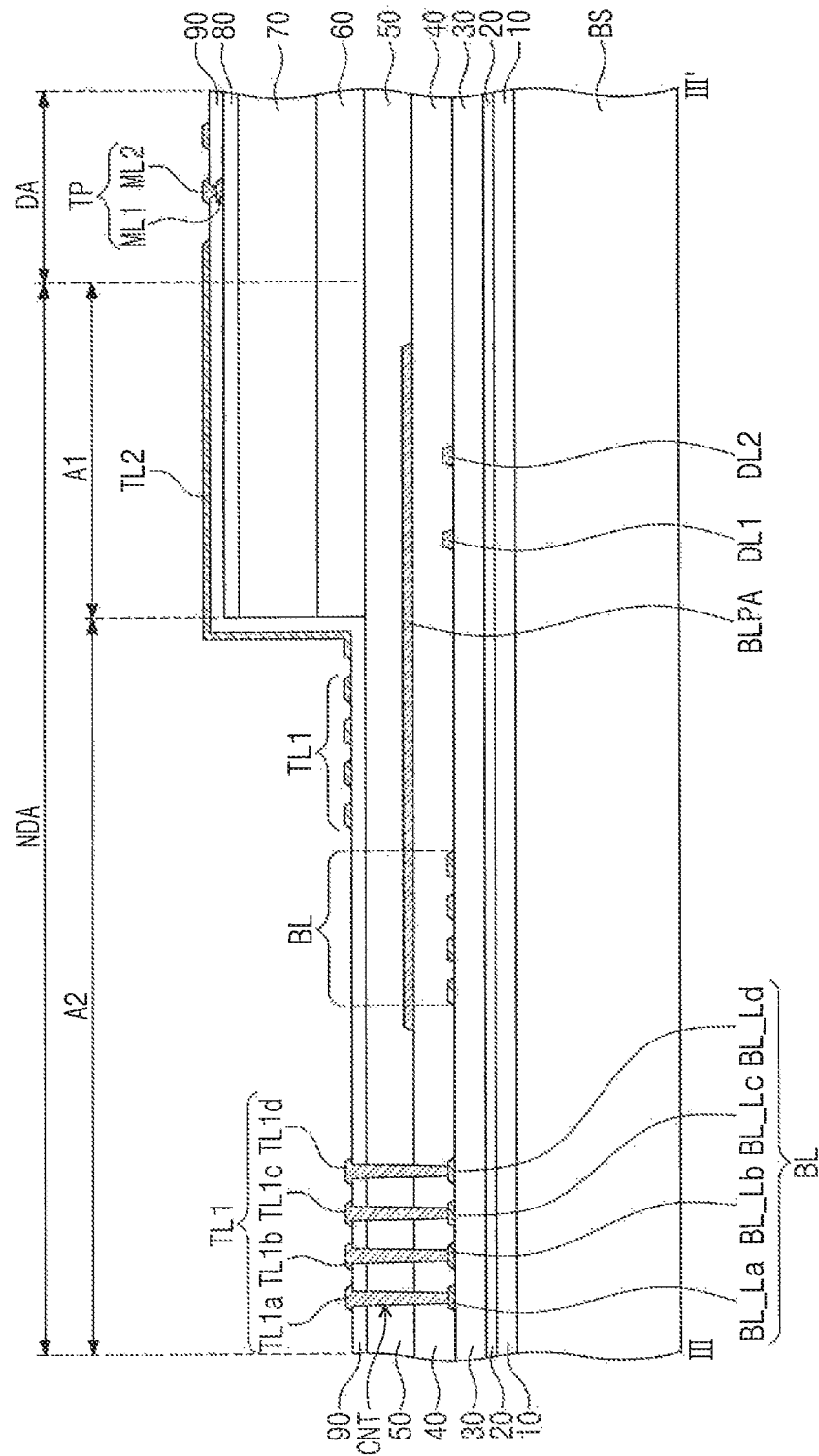
Figure 6C:
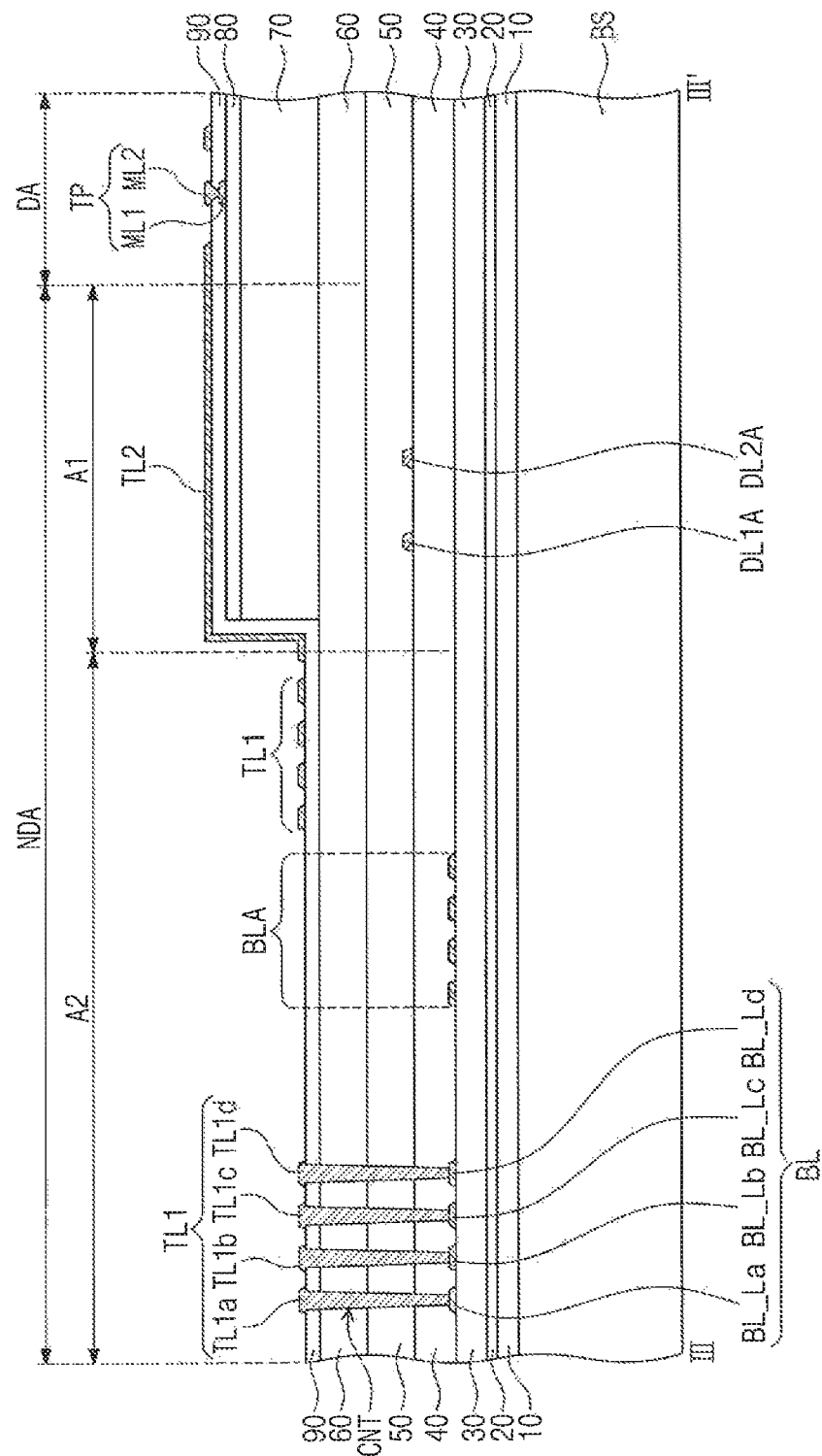

FIG. 5 is a plan view illustrating a portion of an electronic device according to an embodiment of the present inventive concepts. FIGS. 6A to 6C are cross-sectional views illustrating portions of an electronic device according to embodiments of the present inventive concepts. FIG. 5 schematically illustrates a portion of a region in which the first sensing lines TL1 and the bridge lines BL are arranged, and FIGS. 6A to 6C illustrate regions taken along line III-III' of FIG. 5. An embodiment of the present inventive concepts will be described with reference to FIGS. 5 and 6A to 6C. The same reference signs will be used for the same components as described above with reference to the embodiments of FIGS. 1A to 4B, and overlapping descriptions may be omitted for convenience of explanation.

As illustrated in the embodiment of FIG. 5, the first sensing lines TL1 may include eight lines TL1a to TL1h. As described above, the four lines TL1a to TL1d among the eight lines TL1a to TL1h are electrically connected to the bridge lines BL so as to be connected to pads, and the other four lines TL1e to TL1h are directly connected to the pads.

The connection portion CNT in which the four lines TL1a to TL1d are electrically connected to the bridge lines BL may be arranged in the second region A2. As shown in the embodiment of FIG. 5, the four lines TL1a to TL1d and the first to fourth first bridge lines BL_La to BL_Ld are respectively connected through four connection portions CNT_a to CNT_d. As described above, since the connection portions CNT_a to CNT_d are formed in the second region A2 in which the organic layer 72 of the encapsulation layer 70 (see FIG. 4B) is not disposed, a contact hole forming process for forming the connection portions CNT may be easily executed. Therefore, a manufacturing process may be simplified and a process cost may be reduced.

Referring to the embodiments of FIGS. 5 and 6A, the first to fourth first bridge lines BL_La to BL_Ld may be arranged to overlap the first sensing lines TL1 in a plan view. For example, the first to fourth first bridge lines BL_La to BL_Ld may overlap the first sensing lines TL1 in the third direction DR3. The first to fourth first bridge lines BL_La to BL_Ld extend within a region in which the first sensing lines TL1 are arranged.

The first to fourth first bridge lines BL_La to BL_Ld are arranged on a layer different from that of the first sensing lines TL1. For example, as shown in the embodiment of FIG. 6A, the first sensing lines TL1 are arranged on the second sensing insulating layer 90 arranged on the encapsulation layer 70, and the first to fourth first bridge lines BL_La to BL_Ld are arranged under the encapsulation layer 70 and between the fourth insulating layer 40 and the fifth insulating layer 50. The connection portions CNT penetrate the fifth insulating layer 50 and the second sensing insulating layer 90 so as to electrically connect the first sensing lines TL1a to TL1d and the first to fourth first bridge lines BL_La to BL_Ld.

Therefore, at least some of lines connected to the first sensing pads PDT_L (see FIG. 3) may be arranged on different layers. Since the bridge lines BL are arranged on a layer different from that of the first sensing lines TL1, the bridge lines BL and the first sensing lines TL1 may overlap each other in the same region in a plan view. Therefore, since a plurality of signal lines may be easily arranged within a narrow region, an increase of the non-display region NDA may be prevented, and an electronic device having a relatively narrow bezel may be provided.

In the embodiment shown in FIG. 6B, an electronic panel may further include a blocking layer BLPA. The blocking layer BLPA may be provided with a signal independent of the sensing lines TL or the first and second data lines DL1 and DL2. For example, the blocking layer BLPA may be provided with a ground voltage.

The blocking layer BLPA may be arranged between the sensing lines TL, such as the first and second sensing lines TL1, TL2 and the first and second data lines DL1 and DL2 in a cross-sectional view. The blocking layer BLPA may be arranged in a layer between the first and second sensing lines TL1, TL2 and the first and second data lines DL1 and DL2. For example, as shown in the embodiment of FIG. 613, the blocking layer BLPA may be arranged between the fourth insulating layer 40 and the fifth insulating layer 50. However, embodiments of the present inventive concepts are not limited thereto.

The blocking layer BLPA may be arranged overlapping the sensing lines TL, such as the first and second sensing lines TL1, TL2 in a plan view. The blocking layer BLPA may be a shielding electrode. For example, the blocking layer BLPA may prevent electric coupling between the sensing lines TL, such as the first and second sensing lines TL1, TL2 and the first and second data lines DL1 and DL2. However, embodiments of the present inventive concepts are not limited thereto. For example, in an embodiment, the blocking layer BLPA may be arranged to overlap at least a partial portion of the bridge lines BL in a plan view. The blocking layer BLPA may prevent electric coupling between the bridge lines BL and the sensing lines TL.

As shown in the embodiment of FIG. 6C, bridge lines BLA may be arranged between the third insulating layer 30 and the fourth insulating layer 40. The bridge lines BLA may be arranged on various layers provided that the bridge lines BLA are arranged on a different layer from that of the sensing lines TL and overlap the sensing lines TL in a plan view, and are not limited to a certain embodiment.

As shown in the embodiment of FIG. 6C, first and second data lines DL1A and DL2A are illustrated as being arranged on a layer different from that of the bridge lines BLA. For example, the first and second data lines DL1A and DL2A are disposed on a layer between the fourth insulating layer 40 and the fifth insulating layer 50. Therefore, the bridge lines BLA are less likely to be short-circuited with the first and second data lines DL1A and DL2A, and thus may be arranged in various regions regardless of locations of the first and second data lines DL1A and DL2A. However, embodiments of the present inventive concepts are not limited thereto. For example, the bridge lines BLA may be arranged on the same layer as the first and second data lines DL1A and DL2A provided that the bridge lines BLA are spaced apart from the data lines DL1A and DL2A in a plan view, and are not limited to a certain embodiment.

Figure 7A:
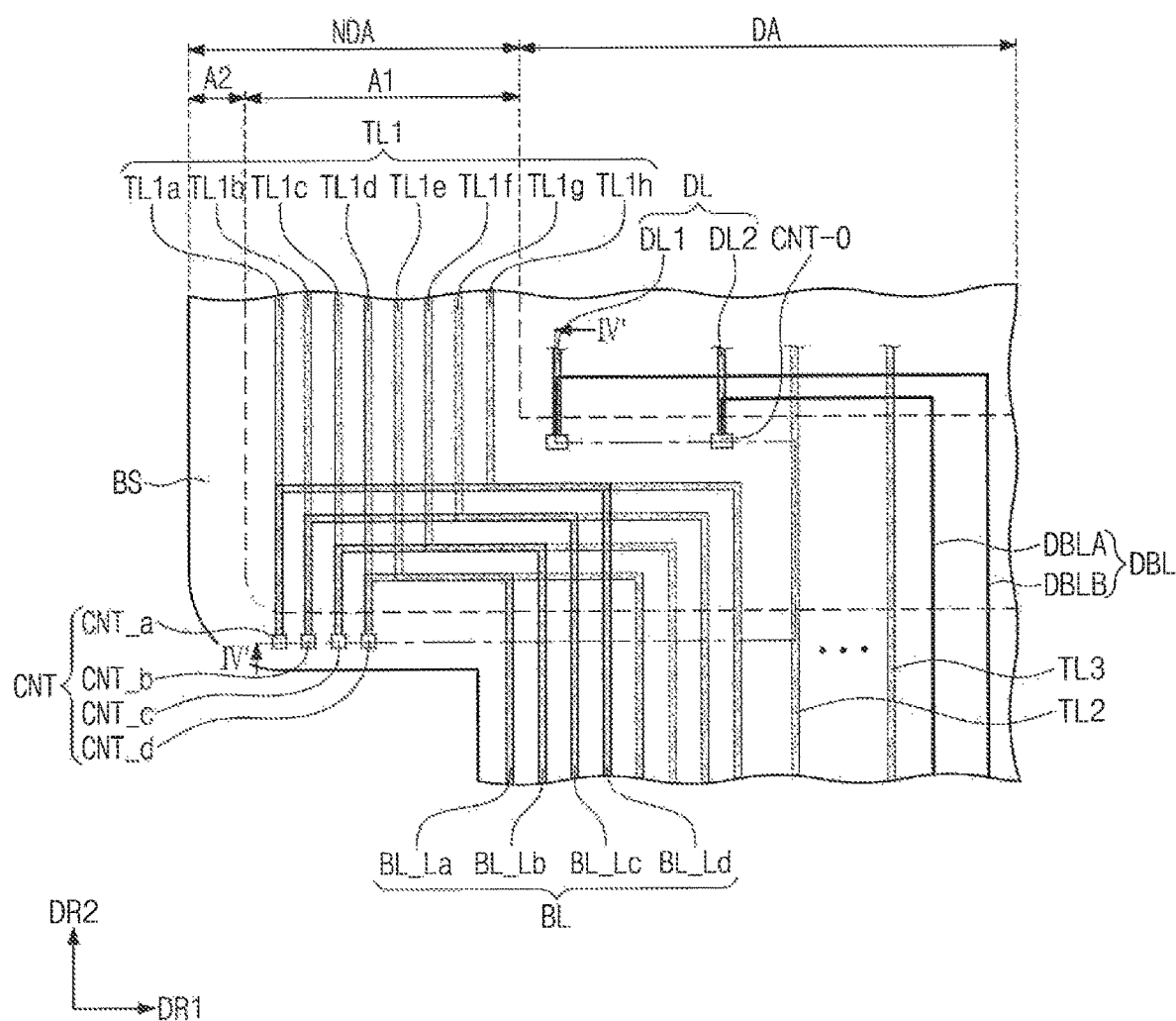
FIG. 7A is a plan view illustrating a portion of an electronic device according to an embodiment of the present inventive concepts.
Figure 7B:
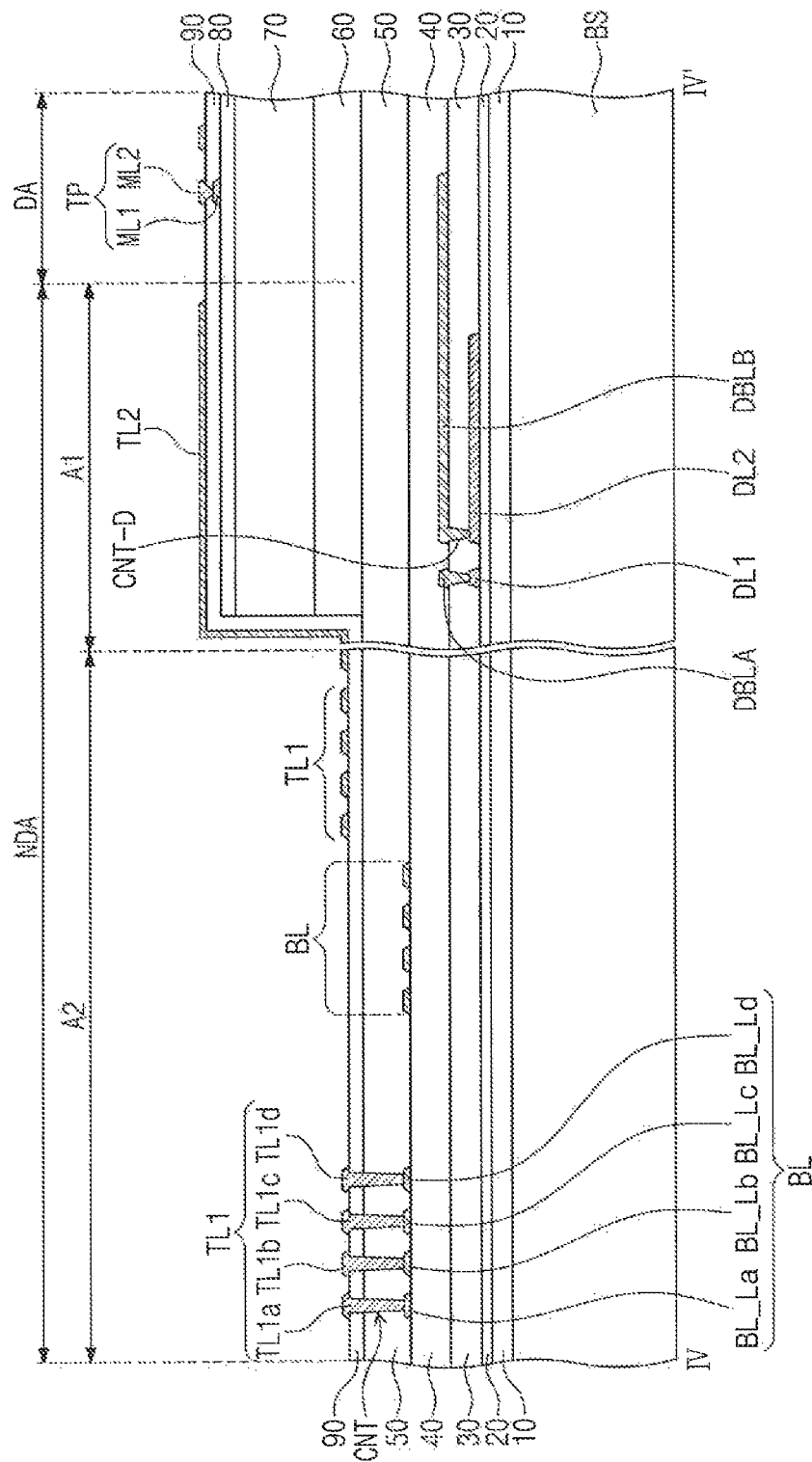
FIG. 7B is a cross-sectional view taken along line IV-IV' of FIG. 7A illustrating a portion of an electronic device according to an embodiment of the present inventive concepts.

FIG. 7A is a plan view illustrating a portion of an electronic device according to an embodiment of the present inventive concepts. FIG. 7B is a cross-sectional view illustrating a portion of an electronic device according to an embodiment of the present inventive concepts. FIG. 7A illustrates a region corresponding to FIG. 5, and FIG. 7B schematically illustrates a cross-section taken along line IV-IV' of FIG. 7A. An embodiment of the present inventive concepts will be described with reference to FIGS. 7A and 7B.

As illustrated in the embodiment of FIG. 7A, the electronic panel may further include first and second data signal bridge lines DBLA and DBLB connected to the first and second data lines DL1 and DL2. The first and second data signal bridge lines DBLA and DBLB may extend within the display region DA in a plan view. The first and second data signal bridge lines DBLA and DBLB at least partially overlap (e.g., in the third direction DR3) the first and second data lines DL1 and DL2 in the display region DA. The first and second data signal bridge lines DBLA and DBLB may be bent from an extending direction of the first and second data lines DL1, DL2 and may extend in a different direction to be electrically connected to the pads PD (see FIG. 2) of the display panel.

As illustrated in the embodiment of FIG. 7B, the first and second data signal bridge lines DBLA and DBLB may be arranged on a layer different from that of the first and second data lines DL1 and DL2. For example, as shown in the embodiment of FIG. 7B, the first and second data signal bridge lines DBLA and DBLB may be arranged between the third insulating layer 30 and the fourth insulating layer 40, and the first and second data lines DL1 and DL2 are arranged between the second insulating layer 20 and the third insulating layer 30. The first and second data signal bridge lines DBLA and DBLB are respectively connected to the first and second data lines DL1 and DL2 through contact portions CNT-O penetrating the third insulating layer 30. The contact portions CNT-O may be in the first region A1 of the non-display region NDA. However, embodiments of the present inventive concepts are not limited thereto and the first and second data signal bridge lines DBLA and DBLB and the first and second data lines DL1 and DL2 may be respectively arranged on various different layers from each other.

According to an embodiment of the present inventive concepts, since the first and second data lines DL1 and DL2 are connected to pads through the first and second data signal bridge lines DBL1 and DBL2, an area provided for the first and second data lines DL1 and DL2 may be reduced in the non-display region NDA. Therefore, the area of the non-display region NDA may be reduced, and an electronic device having a relatively narrow bezel may be provided.

In the embodiment of FIG. 7B, the first and second data signal bridge lines DBLA and DBLB are arranged on a different layer as that of the bridge lines BL. However, embodiments of the present inventive concepts are not limited thereto. For example, the first and second data signal bridge lines DBLA and DBLB may be arranged on a same layer as that of the bridge lines BL, and are not limited to a certain embodiment.

Figure 8:
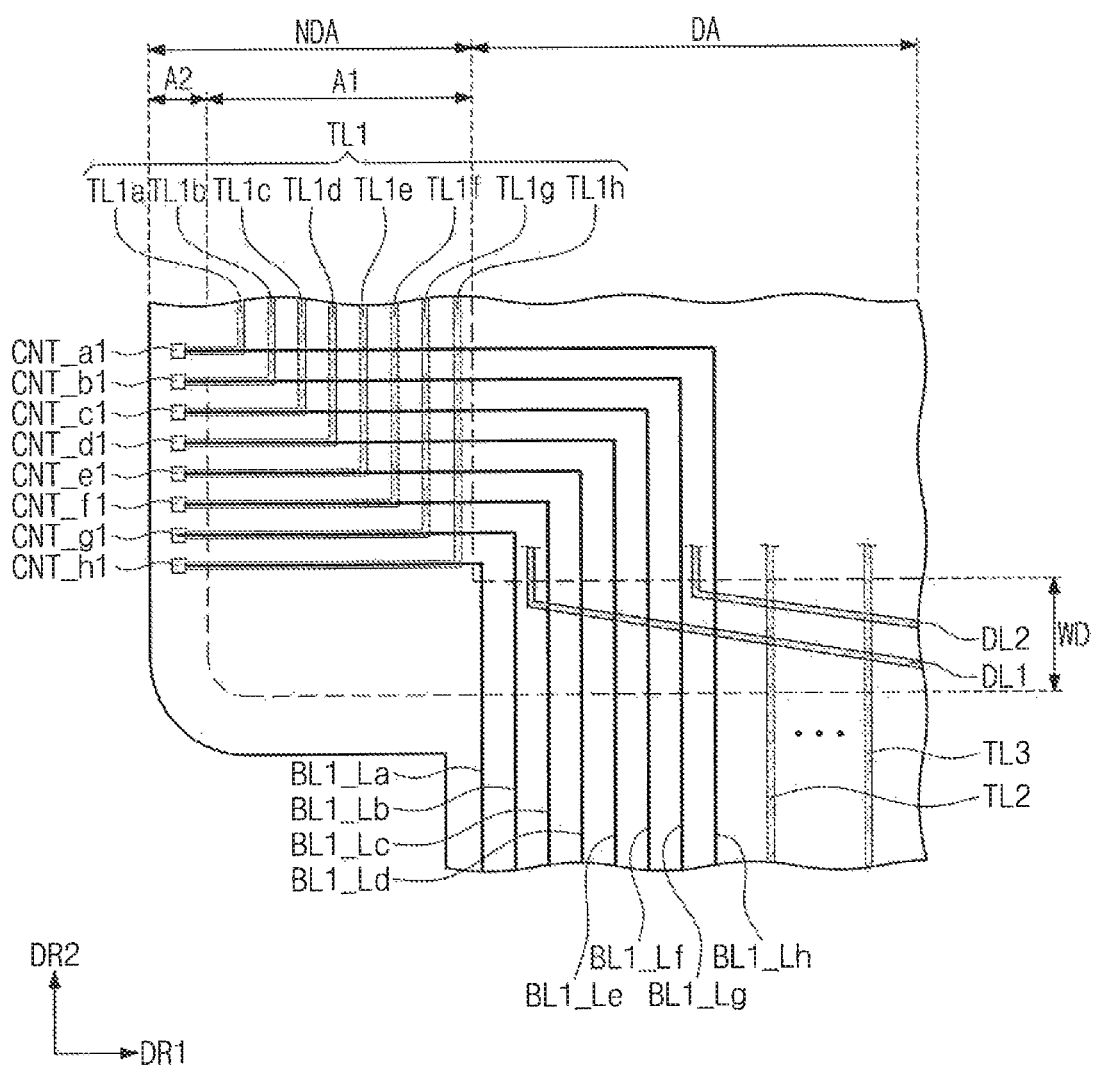
FIG. 8 is a plan view illustrating a portion of an electronic device according to an embodiment of the present inventive concepts.

FIG. 8 is a plan view illustrating a portion of an electronic device according to an embodiment of the present inventive concepts. As illustrated in FIG. 8, in the electronic panel, first bridge lines BL1_La to BL1_Lh may extend within the display region DA. At least a partial portion of the first bridge lines BL1_La to BL1_Lh may overlap the display region DA or the sensing pattern TP. In the embodiment of FIG. 8, the first bridge lines BL1_La to BL1_Lh include eight lines electrically connected to the eight first sensing lines TL1a to TL1h respectively, and each of the first bridge lines BL1_La to BL1_Lh extend within the display region DA. However, embodiments of the present inventive concepts are not limited thereto and the numbers of the first bridge lines may vary and some of the first bridge lines may not extend within the display region DA.

As shown in the embodiment of FIG. 8, connection portions CNT_a1 to CNT_h1 may be arranged in the second region A2 on a left side of the display region DA, and the connection portions CNT_a1 to CNT_h1 may be arranged in the second direction DR2. The first bridge lines BL1_La to BL1_Lh respectively connected to the first sensing lines TL1 through the connection portions CNT_a1 to CNT_h1 may extend in the first direction DR1 so as to overlap the display region DA, and may be bent in the display region DA to extend in the second direction DR2 and to be connected to the sensing pads PDT_L (see FIG. 3).

Since the first bridge lines BL1_La to BL1_Lh overlap the display region DA, the first bridge lines BL1_La to BL1_Lh may be arranged on a layer different from that of components arranged in the display region DA so as to prevent a short circuit. For example, the first bridge lines BL1_La to BL1_Lh may be arranged on a layer different from that of the data lines DL1 to DLn (see FIG. 2), the scan lines SL1 to SLm (see FIG. 2), or the pixel PX. Therefore, the electronic panel may further include an additional insulating layer in addition to the insulating layers illustrated in the embodiments of FIGS. 4A and 4B, and is not limited to a certain embodiment.

According to an embodiment of the present inventive concepts, since the first sensing lines TL1 are connected to the first sensing pads PDT_L via the display region DA, the first sensing lines TL1 may not be arranged in a fan-out region WD defined on a lower end of the display region DA. Therefore, since an area of the fan-out region WD may be reduced, an electronic device having a relatively narrow bezel may be provided.

Figure 9:
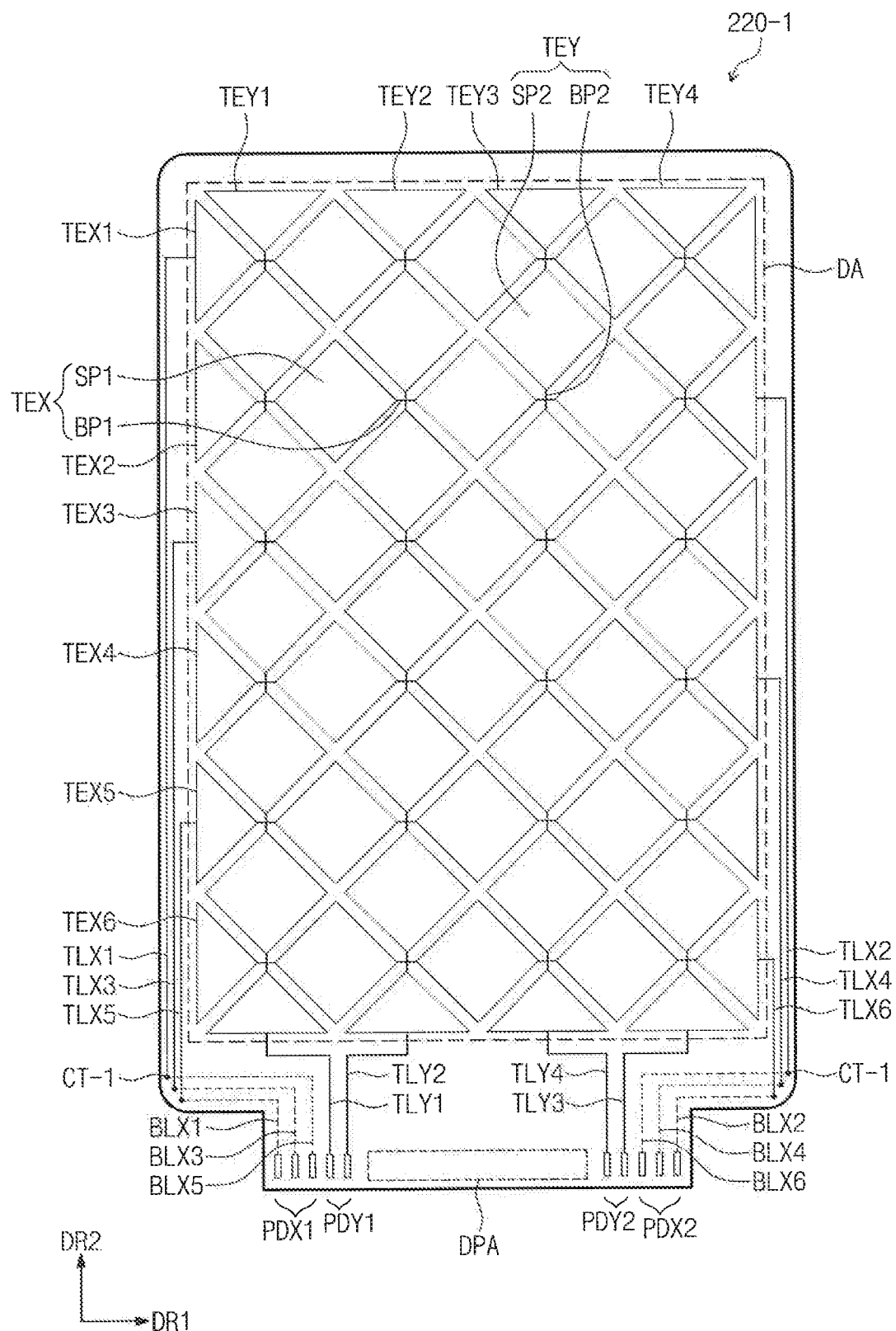
FIG. 9 is a plan view illustrating a sensing unit according to an embodiment of the present inventive concepts.

FIG. 9 is a plan view illustrating a sensing unit according to an embodiment of the present inventive concepts. As illustrated in the embodiment of FIG. 9, a sensing unit 220-1 may be operated in a mutual-capacitive manner. For example, the sensing unit 220-1 may include a plurality of first detection electrodes TEX, a plurality of second detection electrodes TEY, a plurality of first sensing lines, such as first to sixth first sensing lines TLX1 to TLX6, a plurality of second sensing lines, such as first to fourth second sensing lines TLY1 to TLY4, a plurality of bridge lines, such as first to sixth bridge lines BLX1 to BLX6, and a plurality of sensing pads, such as first and second first sensing pads and first and second sensing pads PDX1, PDX2, PDY1, and PDY2.

As shown in the embodiment of FIG. 9, each of the first detection electrodes TEX may include six first detection electrodes, such as first to sixth detection electrodes TEX1 to TEX6 extending in the first direction DR1 and arranged in the second direction DR2. One first detection electrode may include a plurality of first sensing patterns SP1 arranged in the first direction DR1 and a plurality of connection patterns BP1 that connect adjacent first sensing patterns of the first sensing patterns SP1.

Each of the second detection electrodes TEY may include four second detection electrodes, such as first to fourth second detection electrodes TEY1 to TEY4 extending in the second direction DR2 and arranged in the first direction DR1. One second detection electrode may include a plurality of second sensing patterns SP2 arranged in the second direction DR2 and a plurality of connection patterns BP2 that connect adjacent second sensing patterns of the second sensing patterns SP2.

In an embodiment, the first detection electrodes TEX and the second detection electrodes TEY are electrically insulated. The sensing unit 220-1 may detect an external input through a change in capacitance between the first detection electrodes TEX and the second detection electrodes TEY.

The first to sixth first sensing lines TLX1 to TLX6 electrically connect the first to sixth first detection electrodes TEX1 to TEX6 and first and second first sensing pads PDX1 and PDX2. In the present embodiment, a partial portion (e.g., the first sensing pads PDX1) of the first and second first sensing pads PDX1 and PDX2 is arranged on a left side of the display pad region DPA, and the remaining portion (e.g., the second first sensing pads PDX2) of the first and second first sensing pads PDX1 and PDX2 is arranged on a right side of the display pad region DPA. For example, among the first to sixth first sensing lines TLX1 to TLX6, the first, third and fifth first sensing lines TLX1, TLX3, and TLX5 connected to the first, third and fifth first detection electrodes TEX1, TEX3, and TEX5 arranged in an odd-number row may be connected to left sides of the first, third and fifth first detection electrodes TEX1, TEX3, and TEX5, and the second, fourth and sixth first sensing lines TLX2, TLX4, and TLX6 connected to the second fourth and sixth first detection electrodes TEX2, TEX4, and TEX6 arranged in an even-number row may be connected to right sides of the second, fourth and sixth first detection electrodes TEX2, TEX4, and TEX6. However, embodiments of the present inventive concepts are not limited thereto.

The first to fourth second sensing lines TLY1 to TLY4 electrically connect the first to fourth second detection electrodes TEY1 to TEY4 and the first and second sensing pads PDY1 and PDY2. In the present embodiment, a partial portion (e.g., the first second sensing pad PDY1) of the first and second second sensing pads PDY1 and PDY2 is arranged on a left side of the display pad region DPA, and the remaining portion (e.g., the second sensing pad PDY2) of the first and second sensing pads PDY1 and PDY2 is arranged on a right side of the display pad region DPA. For example, among the first to fourth second sensing lines TLY1 to TLY4, the first and second sensing lines TLY1 and TLY2 connected to the first and second detection electrodes TEY1 and TEY2 arranged on a left side with respect to a center of the display region DA may be connected to the first second sensing pads PDY1 arranged on a left side of the display pad region DPA, and the third and fourth second sensing lines TLY3 and TLY4 connected to the third and fourth second detection electrodes TEY3 and TEY4 arranged on a right side with respect to the center of the display region DA may be connected to the second sensing pads PDY2 arranged on a right side of the display pad region DPA.

Therefore, the first and second first sensing pads and the first and second sensing pads PDX1, PDX2, PDY1, and PDY2 may be easily arranged horizontally symmetrically with respect to the display pad region DPA. However, embodiments of the present inventive concepts are not limited thereto and the arrangement of the first and second first sensing pads and first and second sensing pads PDX1, PDX2, PDY1, and PDY2 or the first to sixth first sensing lines TLX1 to TLX6 and first to fourth second sensing lines TLY1 to TLY4 may be designed in various manners, and is not limited to a certain embodiment.

The first to sixth first sensing lines TLX1 to TLX6 may be respectively connected to the first to sixth bridge lines BLX1 to BLX6. The first to sixth bridge lines BLX1 to BLX6 electrically connect the first to sixth first sensing lines TLX1 to TLX6 and the first and second first sensing pads PDX1 and PDX2 through connection portions CT-1. The first to sixth bridge lines BLX1 to BLX6 may be arranged on a layer different from that of the first to sixth first sensing lines TLX1 to TLX6. Furthermore, the first to sixth bridge lines BLX1 to BLX6 may be arranged on a layer different from that of the first to fourth second sensing lines TLY1 to TLY4. Therefore, an area of the non-display region NDA for arranging the first to sixth first sensing lines TLX1 to TLX6 and the first to fourth second sensing lines TLY1 to TLY4 may be reduced.

The first sensing pads PDX1 arranged on the left side of the display pad region DPA may be arranged in reverse order in the first direction DR1. Since the first, third and fifth bridge lines BLX1, BLX3, and BLX5 extend so as to overlap and intersect the first, third and fifth first sensing lines TLX1, TLX3, and TLX5, an order of the pads PDX1 may be changed. For example, a pad connected to the first detection electrode TEX1 arranged in a first row, a pad connected to the third first detection electrode TEX3 arranged in a third row, and a pad connected to the fifth first detection electrode TEX5 arranged in a fifth row are arranged in a direction opposite to the first direction DR1. The order of the first sensing pads PDX1 arranged on a left side with respect to the display pad region DPA may be different from the order of the second first sensing pads PDX2 arranged on a right side with respect to the display pad region DPA. According to an embodiment of the present inventive concepts, the area of the non-display region NDA may be reduced through the first to sixth bridge lines BLX1 to BLX6 also in the mutual-capacitive type sensing unit 220-1, and an electronic device having a relatively narrow bezel may be provided.

According to an embodiment of the present inventive concepts, the area of a region other than a display region may be reduced in an electronic device capable of detecting an external input. Therefore, an electronic device having a relatively narrow bezel may be provided, and a desirable outward appearance of the electronic device may be provided.

Although embodiments of the present inventive concepts have been described, it is understood that the present inventive concepts should not be limited to these embodiments but various changes and modifications can be made by one ordinary skilled in the art within the spirit and scope of the present inventive concepts.

What is claimed is:

1. An electronic device comprising:
a display unit comprising a plurality of pixels, each of the plurality of pixels includes a transistor and a light-emitting element, a plurality of signal lines connected to the plurality of pixels, and an encapsulation layer covering the plurality of pixels, the display unit includes a display region and a non-display region adjacent to the display region in a plan view; and
a sensing unit comprising a plurality of sensing patterns overlapping the display region, a plurality of sensing pads overlapping the non-display region, a plurality of sensing lines electrically connected to the plurality of sensing patterns and the plurality of sensing pads, and a bridge line connected to a first sensing line of the plurality of sensing lines and a corresponding first sensing pad of the plurality of sensing pads, the bridge line is disposed on a different layer than the first sensing line, wherein the bridge line comprises:
a first line portion extending on the different layer than the first sensing line in a direction that is parallel to an extending direction of the first sensing line; and
a second line portion bent from the first line portion and extending on the different layer than the first sensing line in a direction that is different from an extending direction of the first line portion.

2. The electronic device of claim 1, wherein the bridge line overlaps, in the plan view, at least a partial portion of non-connected sensing lines comprising sensing lines of the plurality of sensing lines that the bridge line is not connected thereto.

3. The electronic device of claim 2, further comprising a shielding electrode arranged in a layer between the bridge line and the at least partial portion of the non-connected sensing lines.

4. The electronic device of claim 1, wherein the bridge line is arranged under the encapsulation layer in a cross-sectional view.

5. The electronic device of claim 4, wherein the bridge line is arranged on the same layer as at least one of components of the transistor or components of the light-emitting element.

6. The electronic device of claim 4, wherein the bridge line is arranged on the same layer as at least one of the plurality of signal lines.

7. The electronic device of claim 1, wherein:
the bridge line and the first sensing line are electrically connected through a connection portion penetrating at least one predetermined insulating layer,
wherein the connection portion does not overlap the encapsulation layer in the plan view.

8. The electronic device of claim 7, wherein:
the encapsulation layer comprises a first inorganic layer, a second inorganic layer arranged on the first inorganic layer, and an organic layer arranged between the first inorganic layer and the second inorganic layer; and
the connection portion does not overlap the first inorganic layer and the second inorganic layer.

9. The electronic device of claim 7, wherein:
the sensing unit further comprises a sensing insulating layer arranged between the plurality of sensing lines and the encapsulation layer; and
the connection portion penetrates the sensing insulating layer.

10. The electronic device of claim 1, wherein the bridge line overlaps at least a partial portion of the plurality of signal lines in the plan view.

11. The electronic device of claim 10, further comprising:
an additional bridge line arranged on a layer different from that of a first signal line of the plurality of signal lines and electrically connected thereto,
wherein the additional bridge line overlaps, in the plan view, at least a partial portion of non-connected signal lines comprising signal lines of the plurality of signal lines that the additional bridge line is not connected thereto.

12. The electronic device of claim 1, wherein the bridge line overlaps the display region in the plan view.

13. The electronic device of claim 1, wherein the display unit comprises a first portion having a first width in a first direction and a second portion having a second width that is different from the first width in the first direction.

14. An electronic device comprising:
a display unit comprising a plurality of pixels, each of the plurality of pixels includes a transistor and a light-emitting element, and an encapsulation layer covering the plurality of pixels, the display unit includes a display region and a non-display region adjacent to the display region in a plan view; and
a sensing unit comprising a plurality of sensing patterns overlapping the display region, a plurality of sensing pads overlapping the non-display region, a plurality of sensing lines electrically connected to the plurality of sensing patterns and the plurality of sensing pads, a bridge line connected to a first sensing line of the plurality of sensing lines and a corresponding first sensing pad of the plurality of sensing pads, and a connection portion connecting the bridge line and the first sensing line,
wherein the bridge line is arranged on a layer different from a layer that the plurality of sensing lines is arranged on, and
the connection portion does not overlap the encapsulation layer and is disposed on an outside of an end of the encapsulation layer in the plan view.

15. The electronic device of claim 14, wherein:
the encapsulation layer comprises a first inorganic layer, a second inorganic layer arranged on the first inorganic layer, and an organic layer arranged between the first inorganic layer and the second inorganic layer; and
the connection portion does not overlap the first inorganic layer and the second inorganic layer.

16. The electronic device of claim 14, wherein:
the sensing unit further comprises a sensing insulating layer arranged between the plurality of sensing lines and the encapsulation layer;
the bridge line is arranged under the encapsulation layer in the plan view; and
the connection portion penetrates the sensing insulating layer to connect the bridge line and the first sensing line.

17. The electronic device of claim 16, wherein:
the display unit includes a plurality of signal lines arranged under the encapsulation layer and connected to the pixels; and the bridge line is arranged on a same layer as a first signal line of the plurality of signal lines.

18. The electronic device of claim 14, wherein the bridge line overlaps, in the plan view, at least a partial portion of non-connected sensing lines comprising sensing lines of the plurality of sensing lines that the bridge line is not connected thereto.

19. The electronic device of claim 14, wherein the bridge line overlaps the display region in the plan view.

20. The electronic device of claim 14, further comprising a shielding electrode arranged in a layer between the bridge line and the sensing lines.

\* \* \* \* \*